(12) United States Patent
Miyaguchi et al.

(10) Patent No.: US 7,541,894 B2
(45) Date of Patent: Jun. 2, 2009

(54) PHASE-SHIFTING CIRCUIT AND MULTIBIT PHASE SHIFTER

(75) Inventors: Kenichi Miyaguchi, Tokyo (JP); Morishige Hieda, Tokyo (JP); Tamotsu Nishino, Tokyo (JP); Masatake Hangai, Tokyo (JP); Moriyasu Miyazaki, Tokyo (JP); Yukihisa Yoshida, Tokyo (JP); Tadashi Takagi, Tokyo (JP); Mikio Hatamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 162 days.

(21) Appl. No.: 10/594,009

(22) PCT Filed: Jul. 27, 2004

(86) PCT No.: PCT/JP2004/010666

§ 371 (c)(1),
(2), (4) Date: Sep. 25, 2006

(87) PCT Pub. No.: WO2006/011198

PCT Pub. Date: Feb. 2, 2006

(65) Prior Publication Data

US 2007/0273456 A1 Nov. 29, 2007

(51) Int. Cl.
*H01P 9/00* (2006.01)
(52) U.S. Cl. ...................... 333/164; 333/139
(58) Field of Classification Search ................ 333/139, 333/161, 164
See application file for complete search history.

(56) References Cited

U.S. PATENT DOCUMENTS 5,701,107 A 12/1997 Kasahara et al.

(Continued)

FOREIGN PATENT DOCUMENTS

JP 48-102548 A 12/1973

(Continued)

OTHER PUBLICATIONS

Masashi Nakatani et al., Information and Communication Engineers Electronics Society Taikai Koen Ronbunshu 1, Sep. 10, 2003, C-2-2, p. 26.

(Continued)

*Primary Examiner*—Don P Le
(74) *Attorney, Agent, or Firm*—Birch, Stewart, Kolasch & Birch, LLP

(57) ABSTRACT

A phase-shifting circuit includes: a first parallel circuit which is connected across input and output terminals of a high frequency signal, composed of a first inductor and a first switching element that exhibits a through state in an ON state and a capacitive property in an OFF state, and produces parallel resonance at a prescribed frequency when the first switching element is in the OFF state; a series circuit composed of a second inductor and a third inductor and connected in parallel with the first parallel circuit; a capacitor having its first terminal connected to a point of connection of the second and third inductors; and a second parallel circuit which is connected across a second terminal of the capacitor and a ground, composed of a fourth inductor and a second switching element that exhibits a through state in an ON state and a capacitive property in an OFF state, and produces parallel resonance at a prescribed frequency when the second switching element is in the OFF state. The phase-shifting circuit establishes by switching an operation mode of setting the first switching element at the ON state and the second switching element at the OFF state, or an operation mode of setting the first switching element at the OFF state and the second switching element at the ON state.

21 Claims, 18 Drawing Sheets

U.S. PATENT DOCUMENTS

| | | | |
|---|---|---|---|
| 6,137,377 A * | 10/2000 | Wallace et al. | 333/139 |
| 2003/0020563 A1 | 1/2003 | Hieda et al. | |
| 2004/0145429 A1* | 7/2004 | Hieda et al. | 333/164 |
| 2004/0155729 A1* | 8/2004 | Ko et al. | 333/164 |

FOREIGN PATENT DOCUMENTS

| | | |
|---|---|---|
| JP | 1-202007 A | 8/1989 |
| JP | 7-33026 U | 6/1995 |
| JP | 8-250963 A | 9/1996 |
| JP | 2001-339276 A | 12/2001 |
| JP | 2002-344201 A | 11/2002 |
| JP | 2004-48176 A | 2/2004 |
| WO | WO-2002/056467 A1 | 7/2002 |
| WO | WO-2005/093951 A1 | 10/2005 |

OTHER PUBLICATIONS

C. F Campbell et al., "A Compact 5-Bit Phase Shifter MMIC for K-Band Satellite Communications Systems", IEEE IMS2000 Proceedings.

* cited by examiner (a)

(b)

# PHASE-SHIFTING CIRCUIT AND MULTIBIT PHASE SHIFTER

TECHNICAL FIELD

The present invention relates to a miniature, low-loss phase-shifting circuit and multibit phase shifter.

BACKGROUND ART

FIG. 28 is a circuit diagram showing a configuration of a conventional phase-shifting circuit disclosed in C. F. Campbell and S. A. Brown, "A Compact 5-Bit Phase Shifter MMIC for K-Band Satellite Communication Systems", IEEE IMS2000 Proceedings. In FIG. 28, the phase-shifting circuit includes a high frequency signal input terminal 101, high frequency signal output terminal 102, first field-effect transistor (abbreviated to "FET" from now on) 103, second FET 104, first inductor 105, second inductor 106, third inductor 107, capacitor 108 and ground 109.

In the circuit, the field-effect transistor (abbreviated to "FET" from now on) 103 operates as a switch for switching between an ON state and OFF state. When a voltage equipotential to a drain voltage and source voltage is applied to a gate terminal, the FET 103 enters into an ON state, and exhibits a resistive property (called "ON resistance" from now on). On the other hand, when a voltage equal to or less than a pinch-off voltage is applied to the gate terminal, the FET 103 enters into an OFF state, and exhibits a capacitive property (called "OFF capacitance" from now on). The other FET 104 operates in the same manner as the FET 103.

FIG. 29 is a circuit diagram showing an equivalent circuit when bringing the FET 103 into the OFF state and FET 104 into the ON state in the phase-shifting circuit of FIG. 28. Here, the reference numeral 110 designates a combined capacitance of the OFF capacitance of the FET 103 and the capacitor 108, and 111 designates the ON resistance of the FET 104. In this case, the equivalent circuit shown in FIG. 29 can be considered as a high-pass filter (abbreviated to "HPF" from now on) composed of the combined capacitance 110, inductor 105 and inductor 106. A high frequency signal input to the high frequency signal input terminal 101 undergoes a phase lead through the HPF, and is output from the high frequency signal output terminal 102.

FIG. 30 is a circuit diagram showing an equivalent circuit when bringing the FET 103 into ON state and FET 104 into OFF state in the phase-shifting circuit of FIG. 28. Here, the reference numeral 112 designates the ON resistance of the first FET 103, and 113 designates the OFF capacitance of the second FET 104. The parallel circuit composed of the inductor 107 and OFF capacitance 113 is set in such a manner as to produce a parallel resonance state at a desired frequency $f_0$. In this case, the equivalent circuit shown in FIG. 30 can be considered as a bandpass filter (abbreviated to "BPF" from now on) that passes a high frequency signal near the frequency $f_0$ under the assumption that the reactance the inductor 105 and inductor 106 exhibit is sufficiently greater than the ON resistance 112. The high frequency signal input to the high frequency signal input terminal 101 is output from the high frequency signal output terminal 102 with nearly zero phase variation through the BPF.

Here, the difference between the phase lead caused by the HPF and the phase variation caused by the BPF is referred to as a necessary phase shift amount. The high frequency signal input through the high frequency signal input terminal 101 obtains the desired phase shift amount by switching the ON/OFF state of the FET 103 and FET 104, and is output from the high frequency signal output terminal 102.

As described above, since the conventional phase-shifting circuit must set the cutoff frequency of the HPF at a frequency lower than the desired frequency bandwidth, the size of the circuit increases as the frequency becomes lower. In addition, since the cutoff frequency of the HPF must be lowered with the reduction in the phase shift amount, the circuit has a problem of increasing its size.

The present invention is implemented to solve the foregoing problems. Therefore it is an object of the present invention to provide a phase-shifting circuit and multibit phase shifter with characteristics of a small size and low loss.

DISCLOSURE OF THE INVENTION

A phase-shifting circuit in accordance with the present invention includes: an input terminal of a high frequency signal; an output terminal of the high frequency signal; a first parallel circuit which is connected across the input terminal and the output terminal, which is composed of a first inductor and a first switching element that exhibits a through state or resistive property in an ON state and a capacitive property in an OFF state, and which produces parallel resonance at a prescribed frequency when the first switching element is in the OFF state; a series circuit which is connected in parallel with the first parallel circuit, and which is composed of a second inductor and a third inductor that have a reactance sufficiently larger than a resistance of the first switching element in the ON state; a capacitor having its first terminal connected to a point of connection of the second inductor and the third inductor; a second parallel circuit which is connected across a second terminal of the capacitor and a ground, which is composed of a fourth inductor and a second switching element that exhibits a through state or resistive property in an ON state and a capacitive property in an OFF state, and which produces parallel resonance at a prescribed frequency when the second switching element is in the OFF state; and applying means of control signals for establishing a first operation mode and a second operation mode by switching between them, the first operation mode setting the first switching element at the ON state and the second switching element at the OFF state, and the second operation mode setting the first switching element at the OFF state and the second switching element at the ON state.

This makes it possible to form a bandpass filter circuit and low-pass filter circuit by switching, and to vary the pass phase of the high frequency signal input, thereby being able to obtain a desired phase shift amount at a low loss. In addition, since the phase-shifting circuit employs the low-pass filter, it can reduce the size of the inductors as compared with a conventional example that employs a high-pass filter, thereby being able to miniaturize itself. Furthermore, since the phase-shifting circuit can be composed of the two switching elements, four inductors, a single capacitor, and a single through hole, it offers an advantage of being able to miniaturize the circuit.

BEST MODE FOR CARRYING OUT THE INVENTION

The best mode for carrying out the invention will now be described with reference to the accompanying drawings to explain the present invention in more detail.

EMBODIMENT 1

Figure 1:
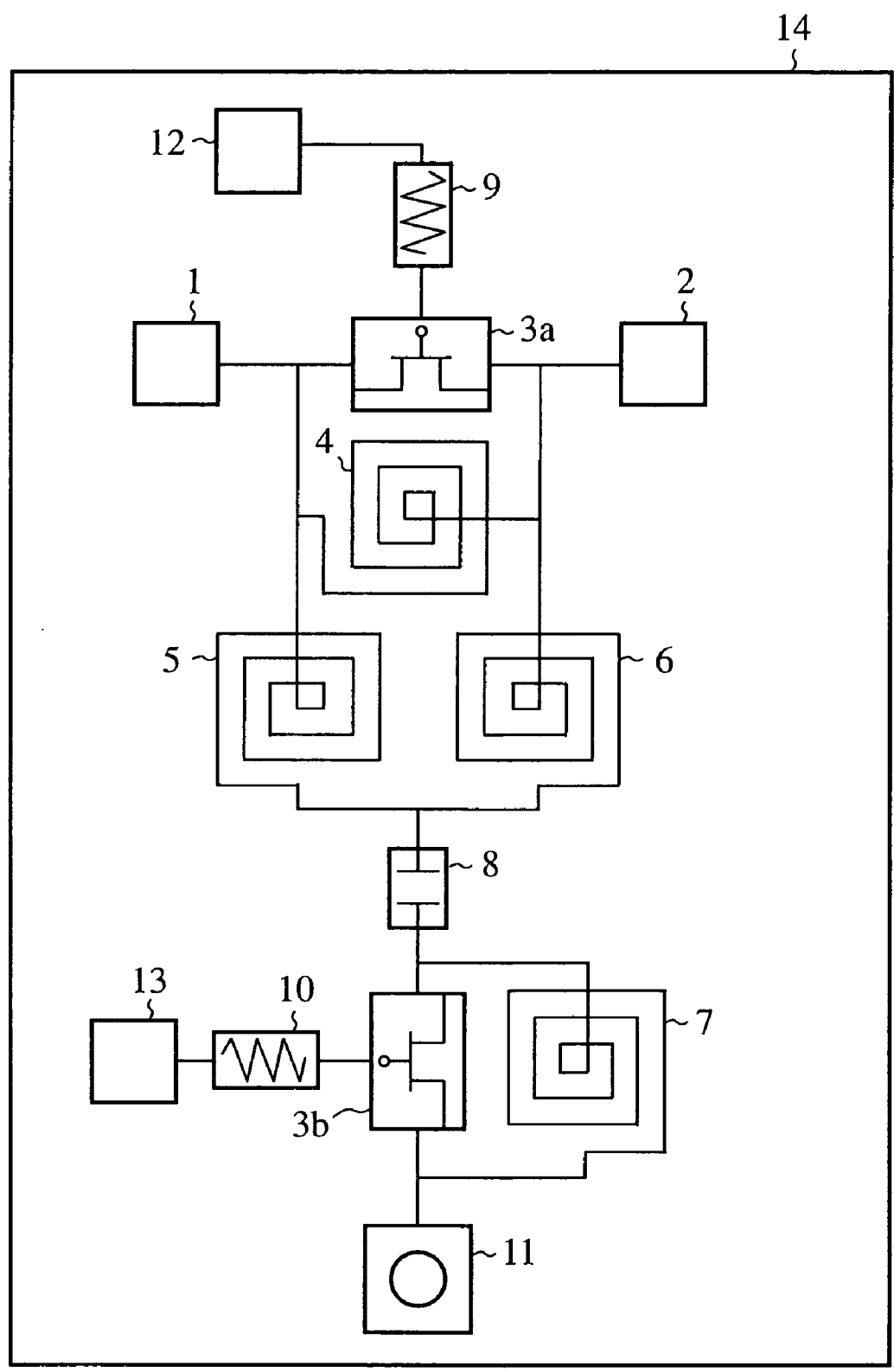
FIG. 1 is a circuit diagram showing a configuration of the phase-shifting circuit of an embodiment 1 in accordance with the present invention.

FIG. 1 is a circuit diagram showing a configuration of the phase-shifting circuit of an embodiment 1 in accordance with the present invention.

In FIG. 1, the phase-shifting circuit is formed monolithically on a semiconductor substrate 14. It is configured in such a manner that a parallel circuit (first parallel circuit) composed of an FET (first switching element) 3*a* and a spiral inductor (first inductor) 4 is connected across a high frequency signal input terminal 1 and an output terminal 2, and that the FET 3*a* has its gate supplied with a first control signal from an input terminal 12 via a resistor 9. In addition, a series circuit composed of a spiral inductor (second inductor) 5 and a spiral inductor (third inductor) 6 is also connected in parallel with the parallel circuit. The point of connection between the spiral inductor 5 and spiral inductor 6 is connected to a first terminal of an MIM capacitor 8. Between a second terminal of the MIM capacitor 8 and a through hole (ground) 11, a parallel circuit (second parallel circuit) composed of the FET (second switching element) 3*b* and spiral inductor 7 is connected. It is further configured in such a manner that the FET 3*b* has its gate supplied with a second control signal from an input terminal 13 via a resistor 10.

Figure 2:
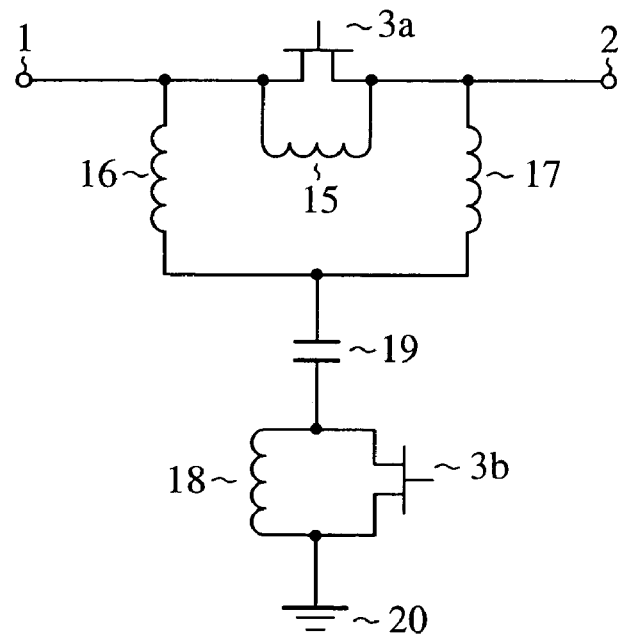
FIG. 2 is a circuit diagram showing an equivalent circuit of the phase-shifting circuit of the embodiment 1 in accordance with the present invention.

FIG. 2 is a circuit diagram showing an equivalent circuit of the phase-shifting circuit of FIG. 1. Comparing FIG. 2 with FIG. 1, an inductor 15 corresponds to the spiral inductor 4, an inductor 16 corresponds to the spiral inductor 5, an inductor 17 corresponds to the spiral inductor 6, and an inductor 18 corresponds to the spiral inductor 7. A capacitor 19 corresponds to the MIM capacitor 8, and a ground 20 corresponds to the through hole 11.

The FET 3a and FET 3b operate as a switch for switching the ON/OFF state in response to the first control signal and second control signal, respectively. The FET 3a enters into the ON state when a voltage equipotential to a drain voltage and source voltage is applied to the gate terminal as the first control signal, and exhibits a resistive property (called "ON resistance" from now on). On the other hand, when a voltage equal to or less than the pinch-off voltage is applied to the gate terminal, the FET 3a enters into the OFF state, and exhibits a capacitive property (called "OFF capacitance" from now on) The FET 3b operates in the same manner in response to the second control signal.

Next, the operation of the phase-shifting circuit of the embodiment 1 will be described with reference to the equivalent circuit of FIG. 2.

Figure 3:
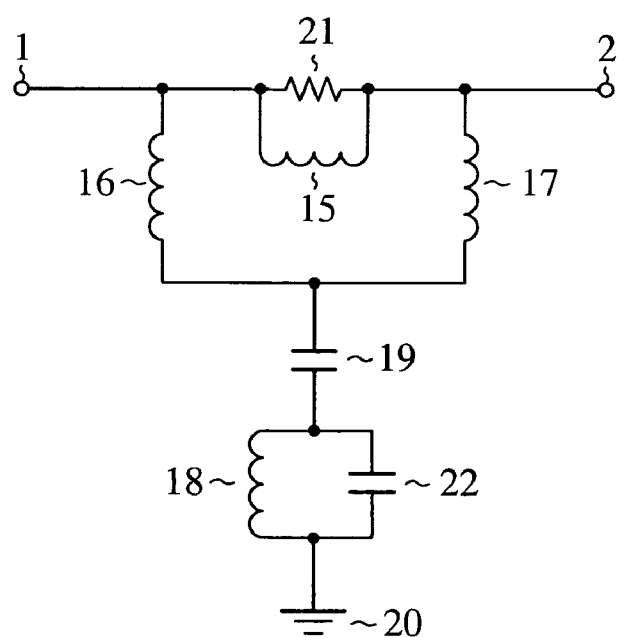
FIG. 3 is a circuit diagram showing an equivalent circuit when the phase-shifting circuit of the embodiment 1 in accordance with the present invention operates as a bandpass filter circuit.

When the control signal sets the FET 3a at the ON state and the FET 3b at the OFF state, the equivalent circuit of FIG. 2 is considered to become the equivalent circuit as shown in FIG. 3. In this operation mode, since the FET 3a is in the ON state, it is represented as an ON resistance 21, and since the FET 3b is in the OFF state, it is represented as an OFF capacitance 22. Here, the parallel circuit composed of the inductor 18 and OFF capacitance 22 is set in such a manner as to bring about a parallel resonance (open) state at a prescribed frequency f0. Since the reactance caused by the inductor 16 and inductor 17 is sufficiently larger than the ON resistance 21 of the FET 3a, the circuit of FIG. 3 can be considered as a bandpass filter circuit with a passband near the prescribed frequency f0. When the ON resistance 21 is sufficiently small, it brings about little phase variation. Accordingly, the high frequency signal input to the input terminal 1 at the prescribed frequency f0 is output from the output terminal 2 without the phase variation.

Figure 4:
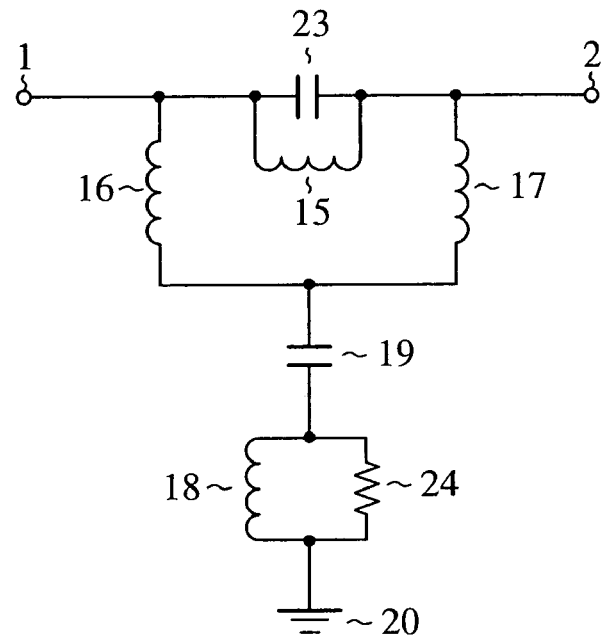
FIG. 4 is a circuit diagram showing an equivalent circuit when the phase-shifting circuit of the embodiment 1 in accordance with the present invention operates as a low-pass filter circuit.

When the control signal sets the FET 3a at the OFF state, and the FET 3b at the ON state, the equivalent circuit of FIG. 2 is considered to become the equivalent circuit as shown in FIG. 4. In this operation mode, since the FET 3a is in the OFF state, it is represented as an OFF capacitance 23, and since the FET 3b is in the ON state, it is represented as an ON resistance 24. Here, when the reactance of the inductor 18 is set sufficiently larger than the ON resistance 24 of the FET 3b, the parallel circuit composed of the ON resistance 24 and inductor 18 can be considered a circuit consisting of only the ON resistance 24. In addition, the parallel circuit composed of the inductor 15 and the OFF capacitance 23 of the FET 3a is set in such a manner as to bring about a parallel resonance (open) state at the prescribed frequency f0. In this case, the circuit as shown in FIG. 4 can be considered a low-pass filter circuit composed of the inductors 16 and 17 and the capacitor 19, and setting its circuit constants appropriately enables the low-pass filter circuit to establish matching, resulting in a low reflection loss. Accordingly, the high frequency signal input to the input terminal 1 is output from the output terminal 2 with a phase lag caused by the low-pass filter circuit.

As described above, the phase-shifting circuit of the present embodiment 1 can switch between the bandpass filter circuit and low-pass filter circuit by setting the operation mode through the ON/OFF switching of the FET 3a and FET 3b, thereby being able to vary the pass phase of the input high frequency signal. In other words, a desired phase shift amount can be achieved by the variation in the pass phase. Thus, the phase-shifting circuit is basically configured with two FETs, four inductors, a single capacitor, and a single through hole, thereby being able to miniaturize the circuit.

In the foregoing conventional phase-shifting circuit, the cutoff frequency of the high-pass filter must be placed lower than the desired central frequency. On the other hand, since the cutoff frequency of the low-pass filter circuit is higher than the desired central frequency, the present embodiment can make the inductance and capacitance smaller than those of the conventional example can, thereby being able to miniaturize the circuit.

Although the phase-shifting circuits from the embodiment 1 to embodiment 4 in accordance with the present invention are described by way of examples that use the FETs as a switching element, this is not essential. Other elements can be used as long as they have a switching function of switching between the ON/OFF states. In addition, although these phase-shifting circuits are monolithically built on the semiconductor substrate 14, they can be configured by placing the passive components on a dielectric substrate and active components on a semiconductor substrate, and by electrically connecting the two substrates via metal wires or golden bumps.

EMBODIMENT 2

Figure 5:
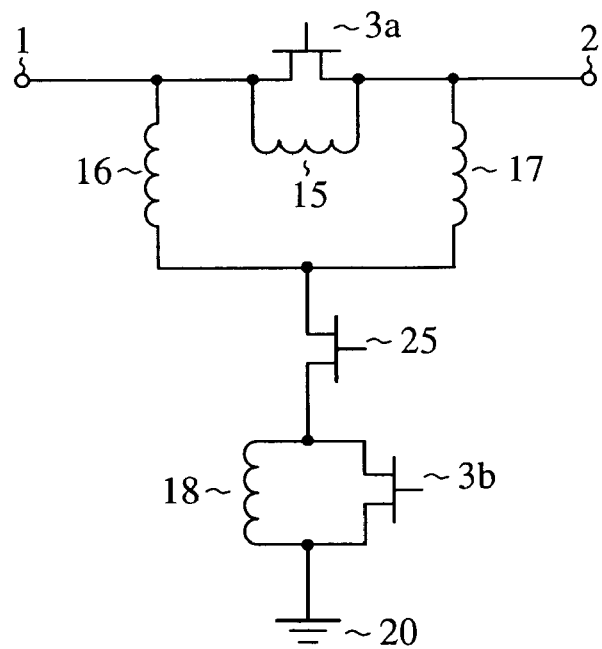
FIG. 5 is a circuit diagram showing a configuration of the phase-shifting circuit of an embodiment 2 in accordance with the present invention.

FIG. 5 is a circuit diagram showing a configuration of the phase-shifting circuit of the embodiment 2 in accordance with the present invention. In FIG. 5, the same or like portions to those of FIG. 2 are designated by the same reference numerals, and duplicate explanation will be omitted basically. The configuration of the phase-shifting circuit includes an FET (third switching element) 25 in place of the capacitor 19 of FIG. 2.

The FET 25, which operates as a switch for switching the ON/OFF state, carries out the operation in the same manner as the FET 3a and FET 3b in response to the control signal.

Next, the operation will be described.

Figure 6:
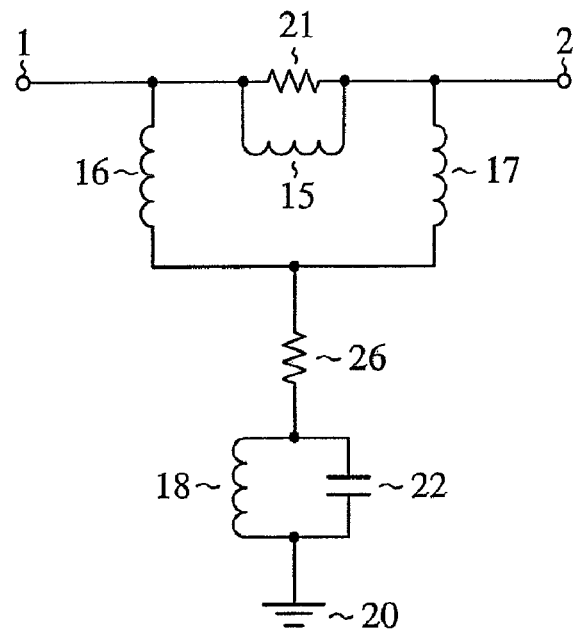
FIG. 6 is a circuit diagram showing an equivalent circuit when the phase-shifting circuit of the embodiment 2 in accordance with the present invention operates as a bandpass filter circuit.

When the control signal sets the FET 3a at the ON state, the FET 3b at the OFF state and the FET 25 at the ON state, the phase-shifting circuit of FIG. 5 is considered to become the equivalent circuit as shown in FIG. 6. In FIG. 6, the same or like components to those of FIG. 3 are designated by the same reference numerals. Here, the FET 25 in the ON state is represented as an ON resistance 26.

In the circuit of FIG. 6, the parallel circuit composed of the inductor 18 and OFF capacitance 22 is set in such a manner as to bring about a parallel resonance (open) state at the prescribed frequency f0 as in the circuit of FIG. 3. Since the reactance caused by the inductor 16 and inductor 17 is sufficiently larger than the ON resistance 21, the phase-shifting circuit can be considered as a bandpass filter circuit with a passband near the prescribed frequency f0 in this operation mode. When the ON resistance 21 is sufficiently small, it brings about little phase variation. Accordingly, the high frequency signal input to the input terminal 1 at the prescribed frequency f0 is output from the output terminal 2 without the phase variation.

In the circuit of the foregoing embodiment 1 as shown in FIG. 3, the series circuit mainly composed of the inductor 16, capacitor 19 and inductor 18 brings about a series resonance state at a frequency lower than the prescribed frequency f0, which can affect the characteristics of the phase-shifting circuit near f0. In contrast with this, the circuit shown in FIG. 6 prevents the series resonance by replacing the capacitor 19 by the ON resistance 26. This can eliminate the effect on the characteristics of the phase-shifting circuit near f0, thereby being able to offer good characteristics.

Figure 7:
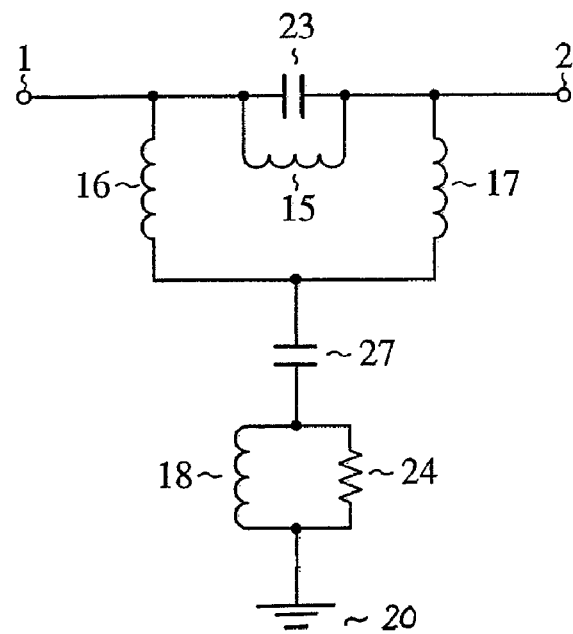
FIG. 7 is a circuit diagram showing an equivalent circuit when the phase-shifting circuit of the embodiment 2 in accordance with the present invention operates as a low-pass filter circuit.

In contrast, when the control signal sets the FET 3a at the OFF state, the FET 3b at the ON state and the FET 25 at the OFF state, the phase-shifting circuit of FIG. 5 can be considered the equivalent circuit as shown in FIG. 7. In FIG. 7, the same or like components to those of FIG. 4 are designated by the same reference numerals. Here, the FET 25 in the OFF state is represented as an OFF capacitance 27.

In the circuit of FIG. 7, when the reactance caused by the inductor 18 is set sufficiently larger than the ON resistance 24 as in the circuit of the foregoing embodiment 1 of FIG. 4, the parallel circuit composed of the ON resistance 24 and inductor 18 can be considered as a circuit consisting of only the ON resistance 24. In addition, the parallel circuit composed of the inductor 15 and OFF capacitance 23 is set in such a manner as to bring about the parallel resonance (open) state at a desired frequency f0. In this operation mode, the phase-shifting circuit can be considered a low-pass filter circuit composed of the inductors 16 and 17 and the OFF capacitance 27, and setting its circuit constants appropriately enables the low-pass filter circuit to establish matching, resulting in a low reflection loss. Accordingly, the high frequency signal input to the input terminal 1 is output from the output terminal 2 with a phase lag caused by the low-pass filter circuit.

As described above, the phase-shifting circuit of the present embodiment 2 can switch between the bandpass filter circuit and low-pass filter circuit by setting the operation mode through the ON/OFF switching of the FET 3a, FET 3b and FET 25, thereby being able to vary the pass phase of the high frequency signal input to the input terminal 1. Accordingly, it offers an advantage similar to that of the phase-shifting circuit of the foregoing embodiment 1. In addition, since it does not bring about the series resonance at the frequency lower than the prescribed frequency f0 in the state of the bandpass filter circuit, it offers an advantage of eliminating the adverse effect on the characteristics of the phase-shifting circuit near f0.

EMBODIMENT 3

Figure 8:
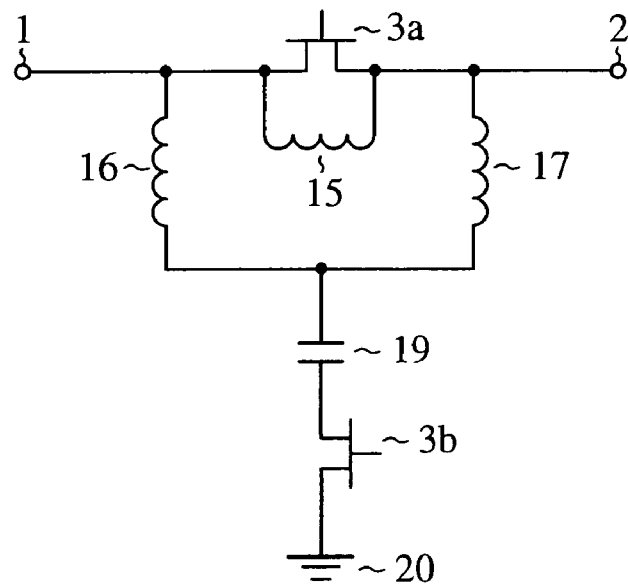
FIG. 8 is a circuit diagram showing a configuration of the phase-shifting circuit of an embodiment 3 in accordance with the present invention.

FIG. 8 is a circuit diagram showing a configuration of the phase-shifting circuit of an embodiment 3 in accordance with the present invention. In FIG. 8, the same or like portions to those of FIG. 2 are designated by the same reference numerals, and duplicate explanation will be omitted basically. The configuration of the phase-shifting circuit replaces the parallel circuit composed of the inductor 18 and FET 3b of FIG. 2 by only the FET 3b (second switching element).

Next, the operation will be described.

Figure 9:
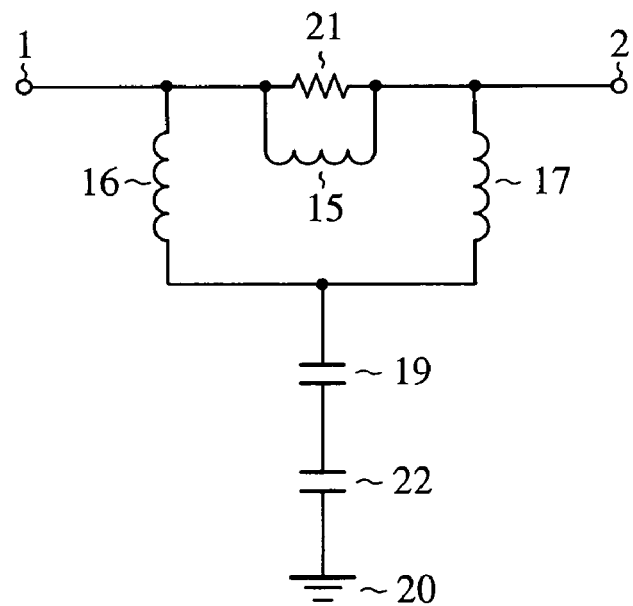
FIG. 9 is a circuit diagram showing an equivalent circuit when the phase-shifting circuit of the embodiment 3 in accordance with the present invention operates as a bandpass filter circuit.

When the control signal sets the FET 3a at the ON state and the FET 3b at the OFF state, the phase-shifting circuit of FIG. 8 can be considered to have an equivalent circuit as shown in FIG. 9. In FIG. 9, the same or like components to those of FIG. 3 are designated by the same reference numerals.

In the circuit of FIG. 9, the combined capacitance of the capacitor 19 and OFF capacitance 22 is set in such a manner to become nearly an open state. Here, since the reactance caused by the inductor 16 and inductor 17 are set sufficiently larger than the ON resistance 21, the circuit can be considered as a through circuit via the ON resistance 21 in this operation mode. When the ON resistance 21 is sufficiently small, it brings about little phase variation. Accordingly, the high frequency signal input to the input terminal 1 is output from the high frequency signal output terminal 2 without causing a phase variation.

Figure 10:
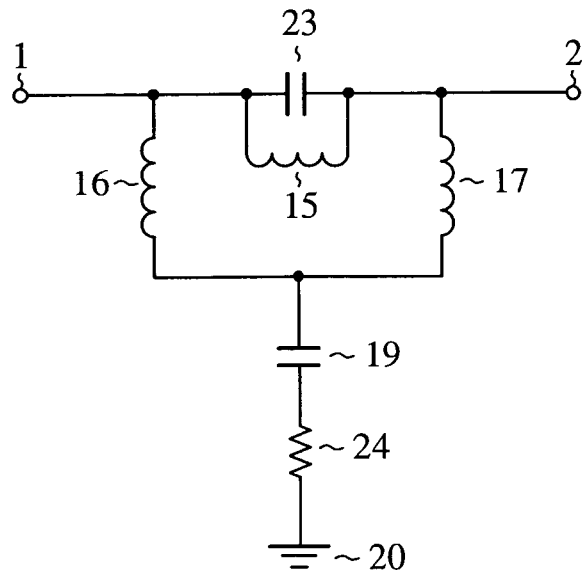
FIG. 10 is a circuit diagram showing an equivalent circuit when the phase-shifting circuit of the embodiment 3 in accordance with the present invention operates as a low-pass filter circuit.

When the FET 3a is set at the OFF state, and the FET 3b is set at the ON state, the circuit of FIG. 8 can be considered to have an equivalent circuit as shown in FIG. 10. In FIG. 10, the same or like components to those of FIG. 4 are designated by the same reference numerals.

In the circuit of FIG. 10, the parallel circuit composed of the inductor 15 and OFF capacitance 23 is set in such a manner as to being about the parallel resonance (open) state at the prescribed frequency f0 as in FIG. 4. Accordingly, the circuit can be considered a low-pass filter circuit composed of the inductors 16 and 17 and capacitor 19 in this operation mode. Appropriately setting the circuit constants can establish the matching, thereby being able to eliminate the reflection loss. Accordingly, the high frequency signal input to the input terminal 1 is output from the output terminal 2 with the phase lag brought about by the low-pass filter circuit.

A similar effect can be achieved by replacing the parallel circuit composed of the inductor 18 and FET 3b in the foregoing embodiment 2 of FIG. 5 by only the FET 3b.

As described above, the phase-shifting circuit of the present embodiment 3 can switch between the through circuit and low-pass filter circuit by setting the operation mode through the ON/OFF switching of the FET 3a and FET 3b, thereby being able to vary the pass phase of the input high frequency signal input to the input terminal 1. Thus, the present embodiment 3 can offer advantages similar to those of the phase-shifting circuit of the foregoing embodiment 1. In addition, since it can remove one inductor from the phase-shifting circuit of the embodiment 1, it can further miniaturize the circuit.

EMBODIMENT 4

Figure 11:
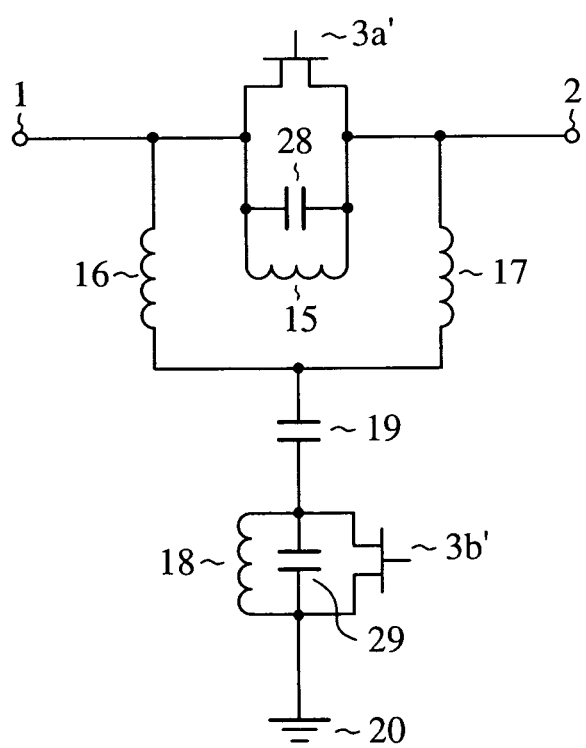
FIG. 11 is a circuit diagram showing a configuration of the phase-shifting circuit of an embodiment 4 in accordance with the present invention.

FIG. 11 is a circuit diagram showing a configuration of the phase-shifting circuit of an embodiment 4 in accordance with the present invention. In FIG. 11, the same or like portions to those of FIG. 2 are designated by the same reference numerals, and duplicate explanation will be omitted basically. The configuration of the phase-shifting circuit includes FETs 3a' and 3b' corresponding to the FETs 3a and 3b of FIG. 2, and capacitors 28 and 29 connected in parallel to them.

When the FET 3a' is set at the ON state and the FET 3b' is set at the OFF state, the phase-shifting circuit of FIG. 11 has the equivalent circuit as shown in FIG. 3 and operates in the same manner. Here, consider implementing the same capacitance as the OFF capacitance 22 of the FET 3b in the foregoing embodiment 1. In the case of FIG. 11 which has the additional capacitor 29, the OFF capacitance of the FET 3b' can be made smaller than that of the FET 3b. Thus, the size of the FET 3b' can be made smaller than that of the FET 3b.

When the FET 3a' is set at the OFF state and the FET 3b' is set at the ON state, the phase-shifting circuit of FIG. 11 has the equivalent circuit as shown in FIG. 4 and operates in the same manner. Here, consider implementing the same capacitance as the OFF capacitance 23 of the FET 3a of the foregoing embodiment 1. In the case of FIG. 11 which has the additional capacitor 28, the OFF capacitance of the FET 3a' can be made smaller than that of the FET 3a. Thus, the size of the FET 3a' can be made smaller than that of the FET 3a.

As described above, the phase-shifting circuit of the present embodiment 4 can offer the same advantages as the embodiment 1. In addition, the present embodiment 4 can reduce the size of the FETs used as the switching elements as compared with the phase-shifting circuit of the embodiment 1, thereby being able to miniaturize the phase-shifting circuit.

EMBODIMENT 5

Figure 12:
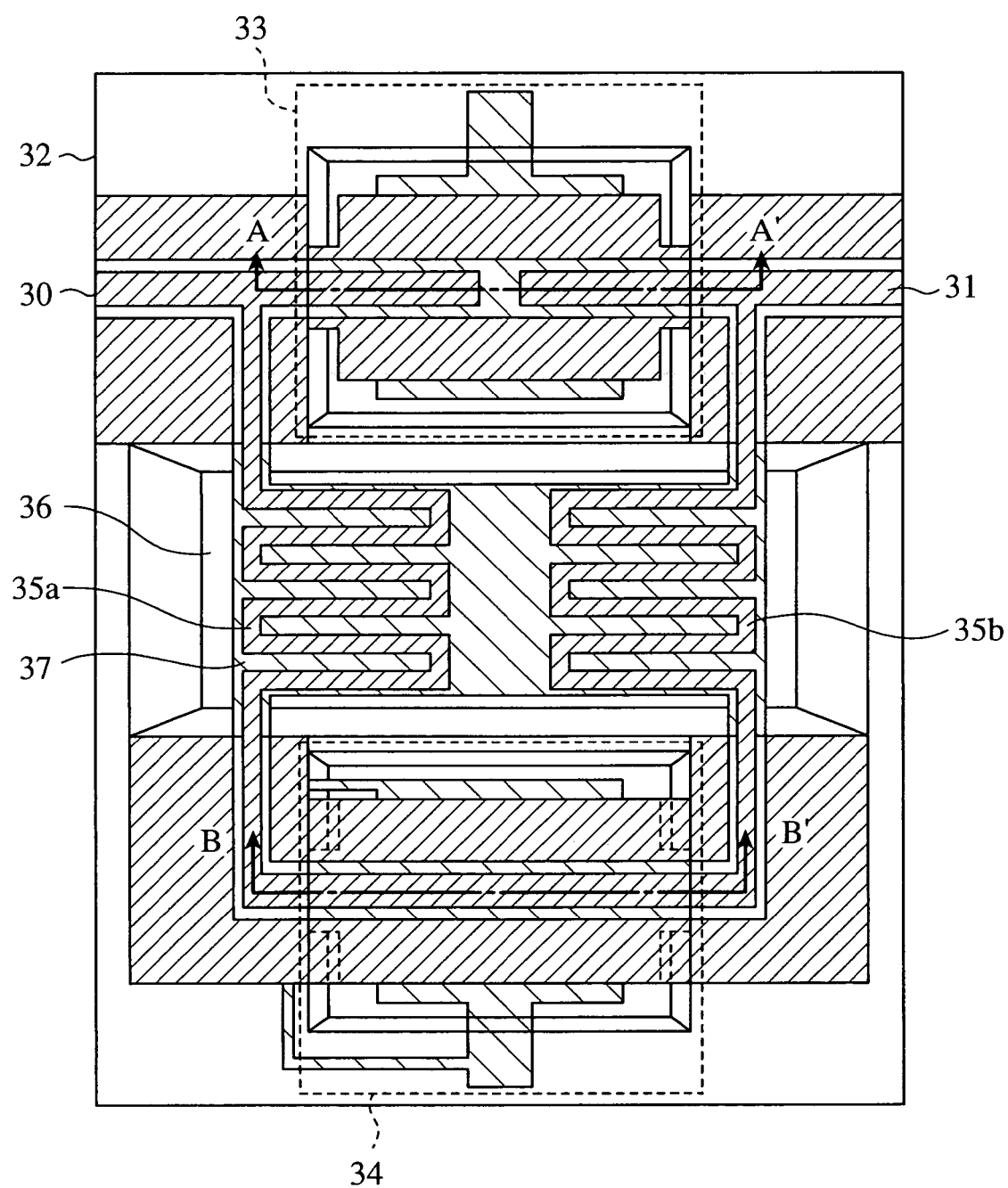
FIG. 12 is a plan view showing a structure of the phase-shifting circuit formed on a substrate of an embodiment 5 in accordance with the present invention.

FIG. 12 is a plan view showing a configuration of the phase-shifting circuit of the embodiment 5 in accordance with the present invention, which is formed on a substrate and has a coplanar line structure.

In FIG. 12, a cavity 36 is formed in a substrate 32 by digging down into the substrate from its one side using micromachining technology. A dielectric supporting film 37 is supported at edges of the cavity 36 in such a manner as to extend across the hollow via an air layer. On the dielectric supporting film 37, two meander lines 35a and 35b are formed at some distance away from each other. Between the undersurface of the cavity 36 and the dielectric supporting film 37, spacing from several microns to several tens of microns are provided. The undersurface of the cavity 36 may be coated with a metal or not coated. On the substrate 32, a through/open switching element (portion enclosed by broken lines) 33 and a through/shunt capacitance switching element (portion enclosed by broken lines) 34 are formed on both sides of the cavity 36.

Figure 13:
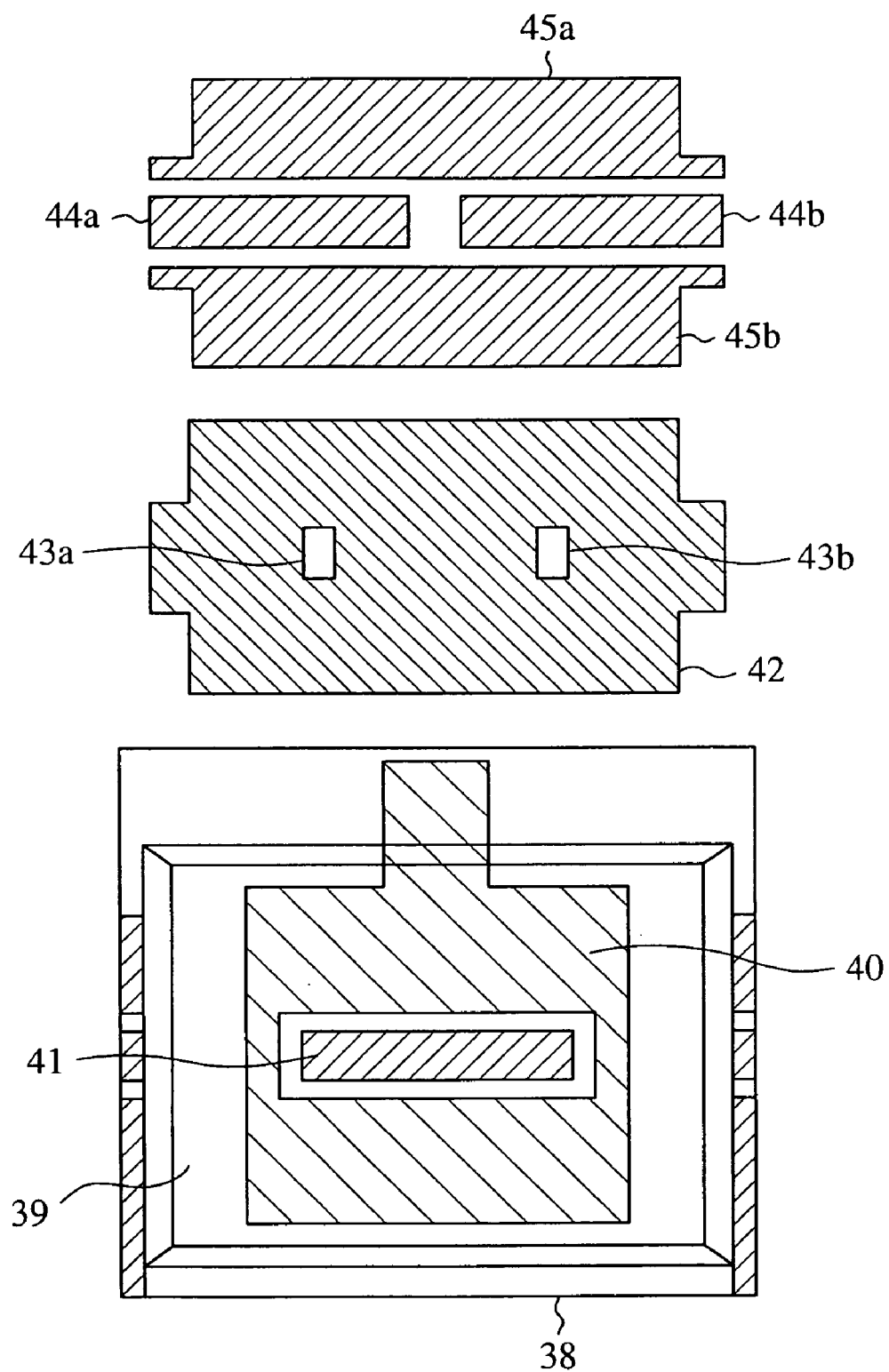
FIG. 13 is an exploded view showing a detailed structure of a through/open switching element of the embodiment 5 in accordance with the present invention.

FIG. 13 is an exploded view showing a detailed structure of the through/open switching element 33 shown in FIG. 12.

The substrate 38 (which is identical to the substrate 32 of FIG. 12) has a cavity 39 formed by digging down into the substrate from its one side using the micromachining technology. A contact metal 41 is formed at the center of the undersurface of the cavity 39. In addition, a control electrode 40 is formed around the contact metal 41 on the undersurface of the cavity 39. The control electrode 40 has a tongue extending upward of the substrate 38 for supplying a control voltage. The dielectric supporting film 42 is supported by the substrate 38 at a pair of edges of the cavity 39 in the location in which the dielectric supporting film 42 faces the contact metal 41 and control electrode 40, and is normally located over the hollow via the air layer of the cavity 39. The dielectric supporting film 42 has a pair of through holes 43a and 43b at the location facing to the contact metal 41. A high frequency signal transmission line 44a and high frequency signal transmission line 44b are placed on the surface of the dielectric supporting film with a spacing between them. They have conductive projections (see FIG. 14 which will be described later) facing to the contact metal 41 at the back of the dielectric supporting film through the pair of through holes 43a and 43b.

The high frequency signal transmission lines 44a and 44b and ground metals 45a and 45b form coplanar lines with the spacing at the center. The dielectric supporting film 42 having the coplanar lines normally extends across the hollow, and the cavity 39 at that case has the spacing from several microns to several tens of microns between its undersurface and the dielectric supporting film 42.

Next, the operation of the through/open switching element 33 will be described.

Figure 14:
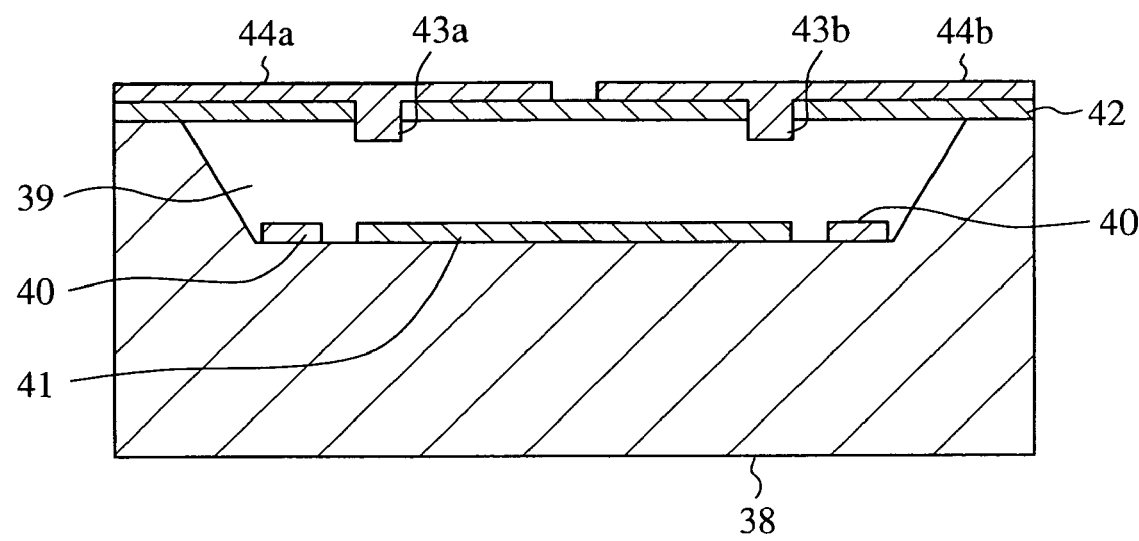
FIG. 14 is a sectional view showing an open-state structure of the through/open switching element of the embodiment 5 in accordance with the present invention.

When the control electrode 40 is not supplied with the control voltage, the structure of the through/open switching element 33 corresponding to the section taken along the line A-A' of FIG. 12 has a sectional view as shown in FIG. 14. This operation mode brings about the open state because the two high frequency signal transmission lines 44a and 44b are separated from each other, and no other conductor lies between them.

Figure 15:
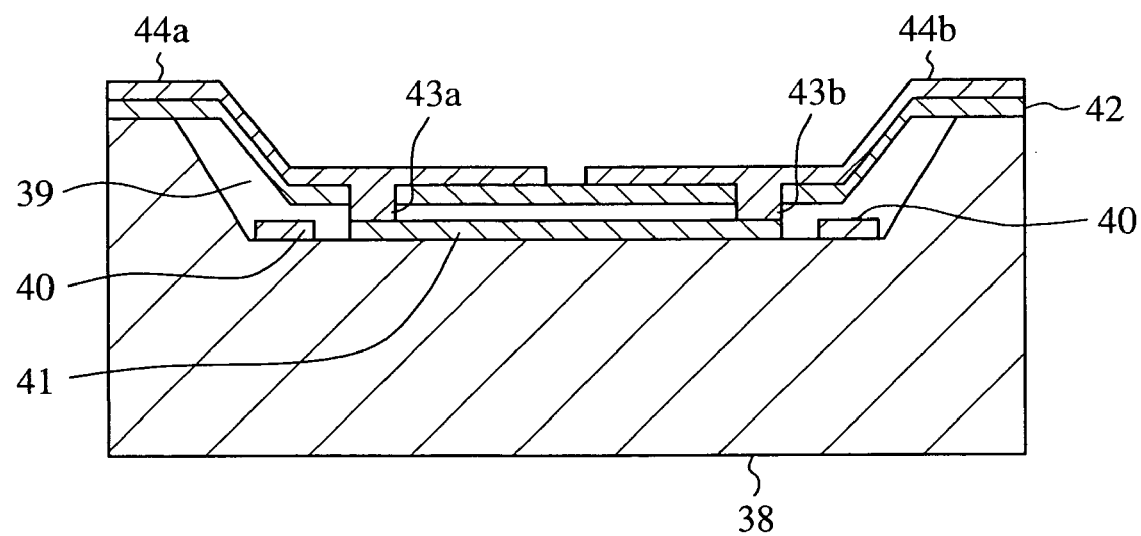
FIG. 15 is a sectional view showing a through-state structure of the through/open switching element of the embodiment 5 in accordance with the present invention.

On the other hand, when the control electrode 40 is supplied with the control voltage, the structure of the through/open switching element 33 corresponding to the section taken along the line A-A' of FIG. 12 has a sectional view as shown in FIG. 15. In this operation mode, the dielectric supporting film 42 undergoes displacement toward the undersurface of the cavity 39 because of the electrostatic attraction between the control electrode 40 and the ground metals 45a and 45b. In this case, since the conductive projections protruding through the through holes 43a and 43b make contact with the contact metal 41, the pair of high frequency signal transmission lines 44a and 44b are brought into conduction, forming a through state.

Figure 16:
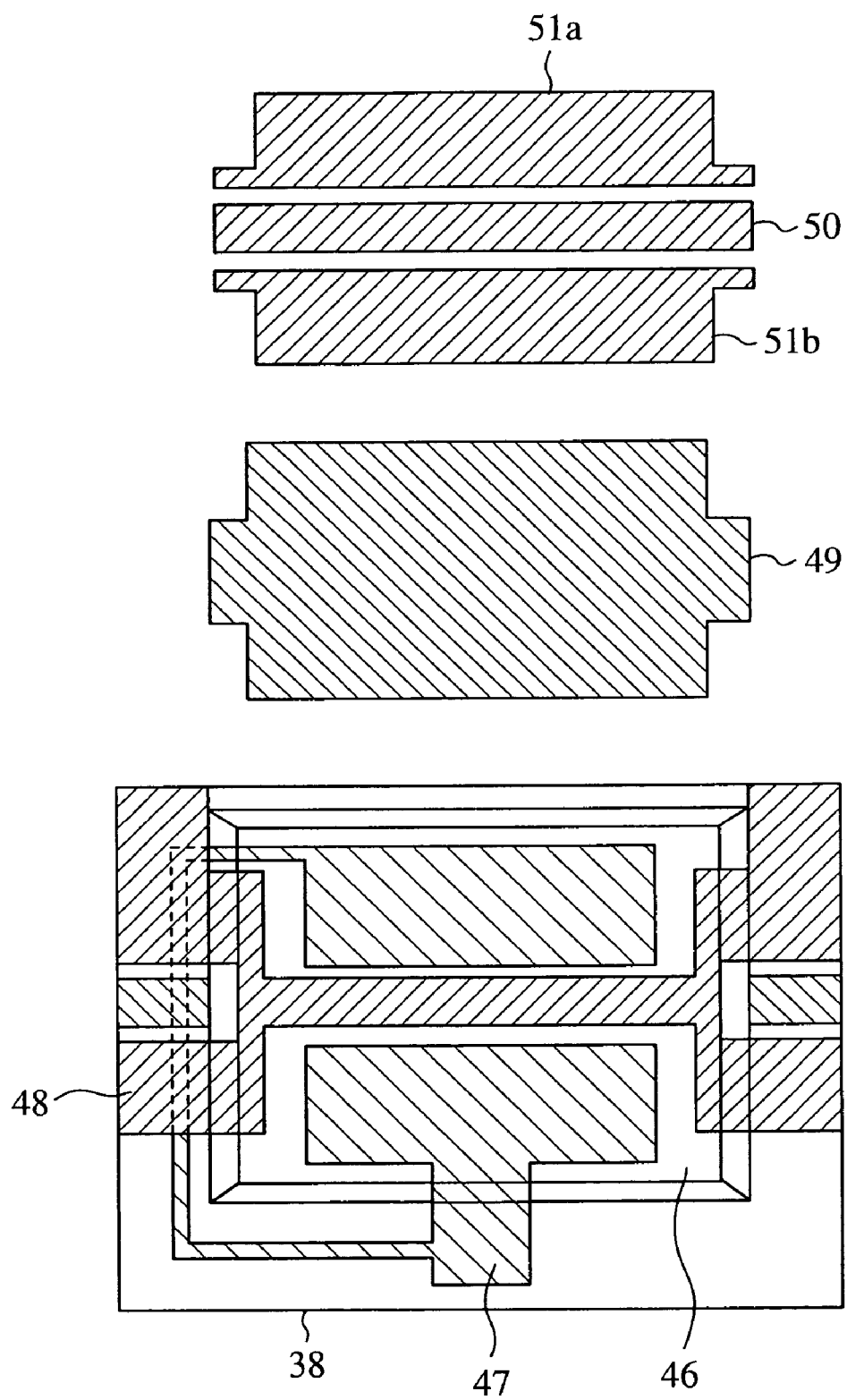
FIG. 16 is an exploded view showing a detailed structure of a through/shunt capacitance switching element of the embodiment 5 in accordance with the present invention.

FIG. 16 is an exploded view showing a detailed configuration of the through/shunt capacitance switching element 34 shown in FIG. 12. In FIG. 16, the same or like components to those of FIG. 13 are designated by the same reference numerals. The through/shunt capacitance switching element 34 has a cavity 46 which is formed by digging down into the substrate 38 (which is identical to the substrate 32 of FIG. 12) from its one side using the micromachining technology. On the undersurface of the cavity 46, a beltlike ground metal (first ground metal) 48 is formed. On the undersurface of the cavity 46, a control electrode 47 is formed on both sides of the ground metal 48. The control electrode 47 and ground metal 48 have portions extending from the undersurface of the cavity 46 up to the substrate 38.

A dielectric supporting film 49 is supported by the substrate 38 at the edges of the cavity 46 in the location facing to the ground metal 48 and control electrode 47 (see FIG. 17 which will be described later), and is normally located over the hollow via the air layer of the cavity 46. The dielectric supporting film 49 has the spacing from several microns to several tens of microns between it and the undersurface of the cavity 46. In addition, the dielectric supporting film 49 is located with facing to the ground metal 48 and control electrode 47. On the dielectric supporting film 49, a high frequency signal transmission line 50 is formed in the location facing to the ground metal 48. In addition, on the dielectric supporting film 49, ground metals (second ground metal) 51a and 51b are formed in locations facing to the control electrode 47. The high frequency signal transmission line 50, ground metals 48, 51a and 51b constitute grounded coplanar lines.

Next, the operation of the through/shunt capacitance switching element 34 will be described.

Figure 17:
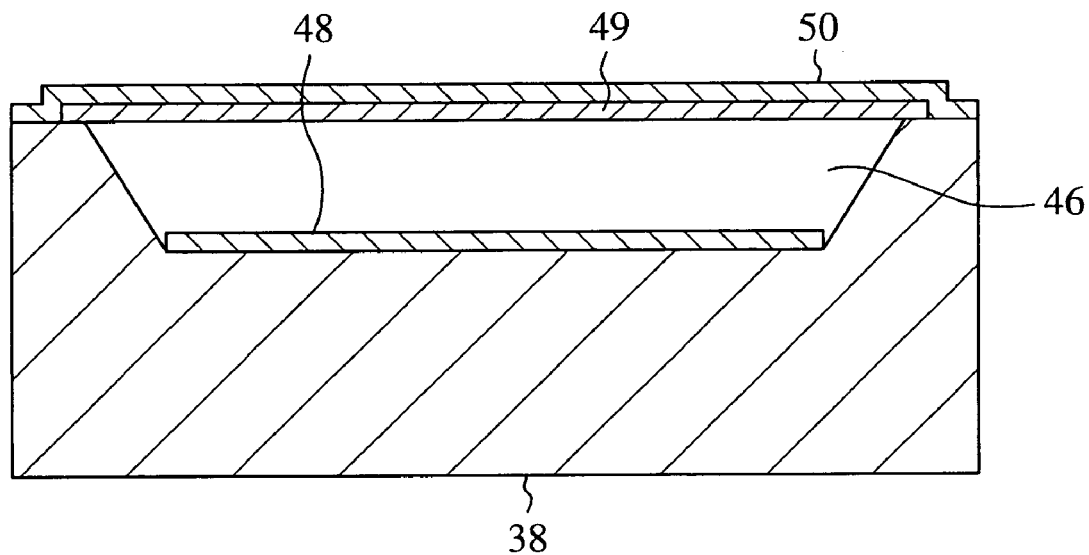
FIG. 17 is a sectional view showing a through-state structure of the through/shunt capacitance switching element of the embodiment 5 in accordance with the present invention.

When the control electrode 47 is not supplied with the control voltage, the structure of the through/shunt capacitance switching element 34 corresponding to the section taken along the line B-B' of FIG. 12 has a sectional view as shown in FIG. 17. In this operation mode, the high frequency signal is transmitted through the grounded coplanar lines. In other words, the through/shunt capacitance switching element 34 forms the through state.

Figure 18:
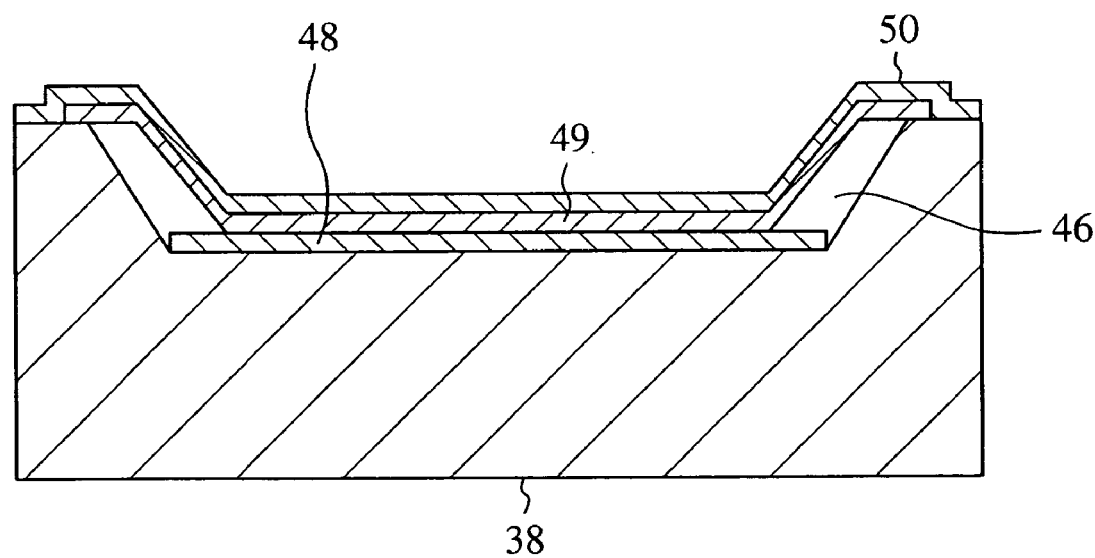
FIG. 18 is a sectional view showing a capacitance state of the through/shunt capacitance switching element of the embodiment 5 in accordance with the present invention.

On the other hand, when the second control electrode 47 is supplied with the control voltage, the structure of the through/shunt capacitance switching element 34 corresponding to the section taken along the line B-B' of FIG. 12 has a sectional view as shown in FIG. 18. In this operation mode, the dielectric supporting film 49 undergoes displacement toward the undersurface of the cavity 46 because of the electrostatic attraction between the ground metals 51a and 51b and the control electrode 47. As a result, the dielectric supporting film 49 makes contact with the ground metal 48, and the high frequency signal transmission line 50 and the ground metal 48 come closer to each other via the dielectric supporting film 49. Accordingly, the high frequency signal transmission line 50 has a capacitance with respect to the ground. Thus, the through/shunt capacitance switching element 34 forms a state having a capacitance against the ground.

Figure 19:
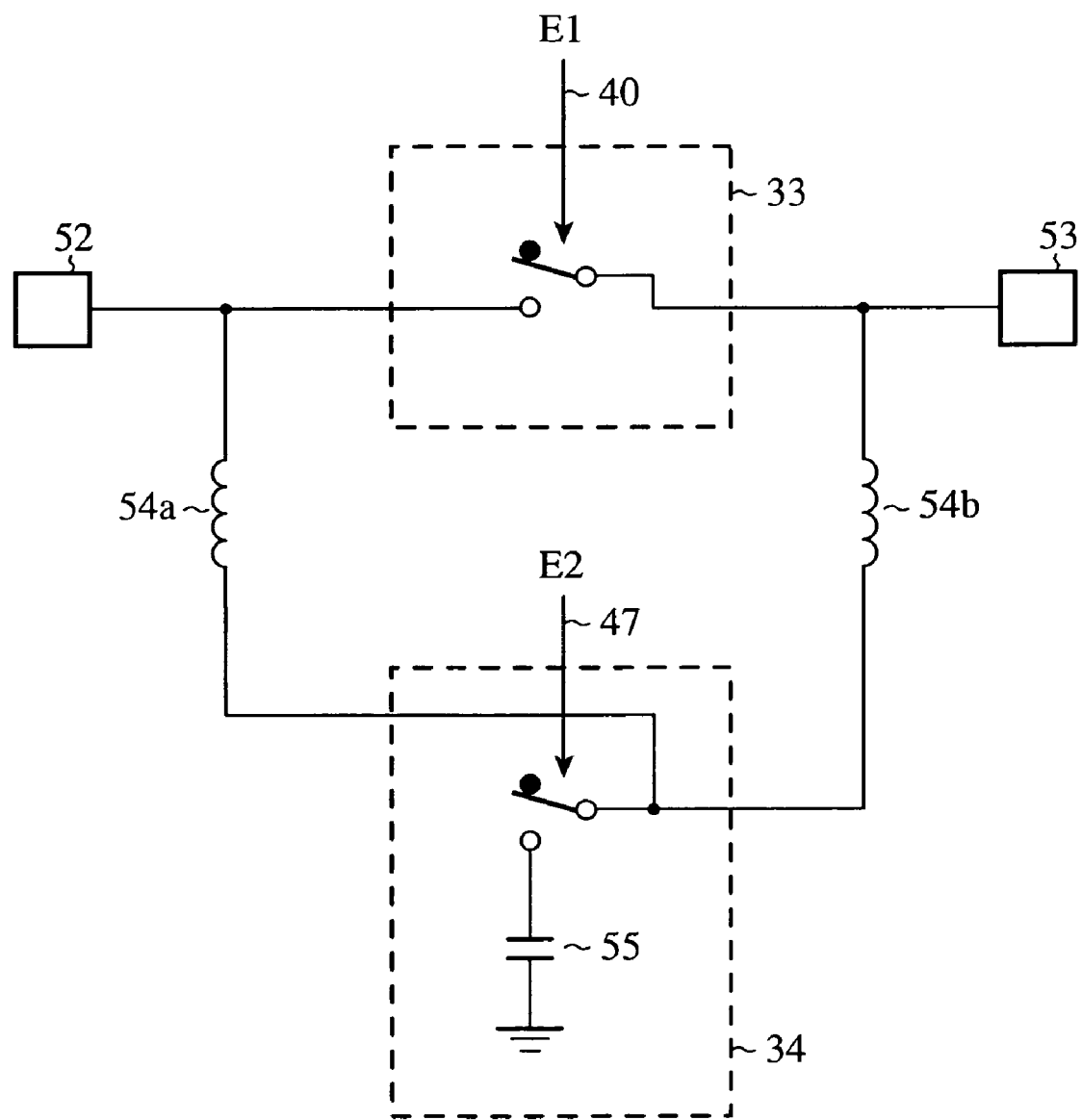
FIG. 19 is a circuit diagram showing an equivalent circuit of the phase-shifting circuit of the embodiment 5 in accordance with the present invention.

Next, the operation of the phase-shifting circuit as shown in FIG. 12 will be described. FIG. 19 is a circuit diagram showing the phase-shifting circuit of FIG. 12 equivalently.

In FIG. 19, the through/open switching element 33, which sets the transmission line at the through state or open state by the control voltage E1, is connected across the input terminal 52 (corresponding to the high frequency signal input terminal 30) of the high frequency signal and an output terminal 53 (corresponding to the high frequency signal output terminal 31). In addition, an inductor 54a (corresponding to the meander line 35a) has its first terminal connected to the input terminal 52, and an inductor 54b (corresponding to the meander line 35b) has its first terminal connected to the output terminal 53. The inductor 54a and inductor 54b have their second terminals connected to the through/shunt capacitance switching element 34 which sets the transmission line at the through state or capacitance state by the control voltage E2. A capacitor 55 represents a capacitance of the through/shunt capacitance switching element 34 against the ground when it is in the shunt capacitance state.

Figure 20:
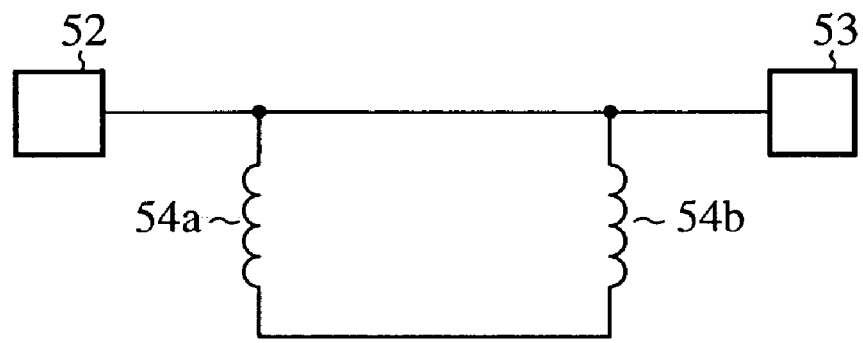
FIGS. 20(*a*) and 20(*b*) are circuit diagrams showing equivalent circuits of a through circuit and low-pass filter circuit of the embodiment 5 in accordance with the present invention.
Figure 20:
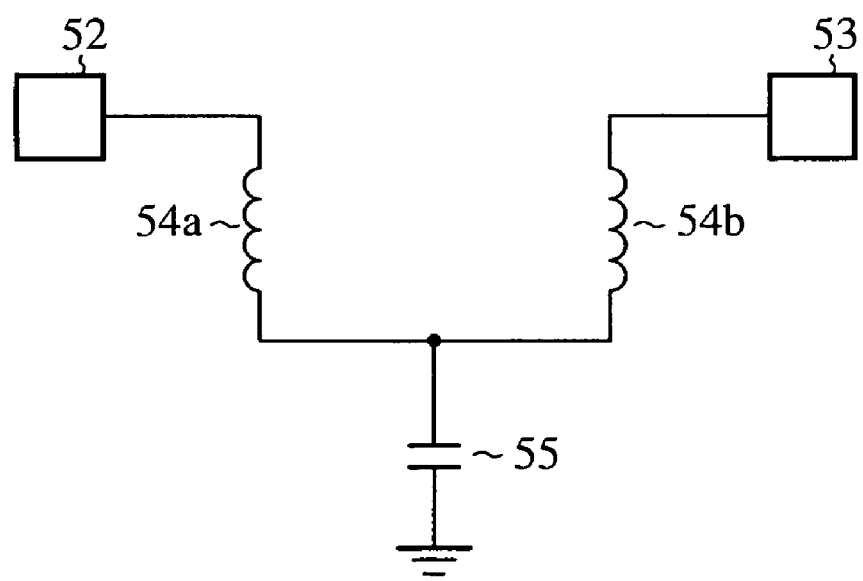

The through/open switching element 33 is switched to the through state by applying the control voltage E1 to the control electrode 40 (see FIG. 15), and at the same time the through/shunt capacitance switching element 34 is set at the through state by not applying the control voltage E2 to the control electrode 47 (equipotential to the ground) (see FIG. 17). In this case, the phase-shifting circuit of FIG. 19 (or of FIG. 12) forms the equivalent circuit as shown in FIG. 20(a). In FIG. 20(a), such a circuit is configured in which a series circuit composed of the two inductors 54a and 54b is connected across the input terminal 52 and output terminal 53, and the input terminal 52 is directly connected to the output terminal 53.

If the reactance caused by the inductors 54a and 54b is large enough, the circuit of FIG. 20(a) in this operation mode can be considered as a through circuit. Accordingly, the high frequency signal input through the input terminal 52 is output from the output terminal 53 without bringing about the phase variation. In this case, the through circuit has no reflection loss because it can establish matching at all the frequencies.

Next, the through/open switching element 33 is made an open state by not applying the control voltage E1 to the control electrode 40 (equipotential to the ground) (see FIG. 14), and at the same time the through/shunt capacitance switching element 34 is set at a shunt capacitance state by applying the control voltage E2 to the control electrode 47 (see FIG. 18). In this case, the phase-shifting circuit of FIG. 19 (or of FIG. 12) forms the equivalent circuit as shown in FIG. 20(b). In FIG. 20(b), the same or like components to those of FIG. 19 are designated by the same reference numerals. The series circuit of the inductors 54a and 54b is connected across the input terminal 52 and output terminal 53b, and the capacitor 55 is connected between the point of connection of the inductors 54a and 54b and the ground.

Here, the circuit of FIG. 20(b) can be considered as a low-pass filter circuit composed of the two inductors 54a and 54b and the capacitor 55. Accordingly, the high frequency signal input to the input terminal 52 undergoes a phase lag through the low-pass filter circuit, and is output from the output terminal 53. In this case, setting its circuit constants appropriately enables the low-pass filter circuit to establish matching, resulting in a low reflection loss. In addition, a desired phase lag can be achieved.

As described above, the phase-shifting circuit of the embodiment 5 can vary the pass phase involved in outputting the high frequency signal input to the input terminal 52 from the output terminal 53 because the through state and the low-pass filtering state is switched by the switching operation of the through/open switching element 33 and that of the through/shunt capacitance switching element 34. In addition, the present embodiment 5 can further reduce the loss as compared with the cases such as the conventional examples and the embodiments 1-4 that employ the semiconductor switching elements. This is because the present embodiment 5 uses as the switching elements the through/open switching element and through/shunt capacitance switching element which are fabricated through the micromachining technology and are driven mechanically. Furthermore, since the present embodiment 5 employs the hollow structure based on the micromachining technology, the high-frequency characteristic is little affected by the substrate. Thus, it is possible to employ a low-cost substrate such as a low resistance silicon substrate and glass substrate, and hence to reduce the cost as compared with the case of using a semiconductor substrate.

Although the phase-shifting circuit described in connection with FIG. 12 employs as the inductors the hollow structure meander lines of the cavity formed by the single-side micromachining of the substrate, spiral inductors can also be used which are formed by patterning the two sides of the dielectric supporting film. In addition, meander lines with a structure other than the hollow structure can be formed on the substrate. Furthermore, although the foregoing phase-shifting circuit has the high frequency signal transmission lines formed on the dielectric supporting films in the through/open switching element and through/shunt capacitance switching element, another dielectric supporting film can be formed on the high frequency signal transmission lines to make a three-layer structure. This structure, in which the metal patterns are sandwiched between the dielectric supporting films, can make the stress symmetrical in the vertical direction, and hence make it flat. Moreover, it is also possible to form a package by preparing another substrate having a cavity formed by the single-side micromachining, and covering the phase-shifting circuit from the top. This enables the mechanically driven through/open switching element and through/shunt capacitance switching element to be sealed to be protected from moisture and the like, thereby being able to increase the reliability.

Embodiment 6

The configuration of the phase-shifting circuit of the present embodiment 6 is obtained by replacing in the phase-shifting circuit of the foregoing embodiment 5 of FIG. 12 the through/open switching element 33 by a through/open switching element of FIG. 21 which will be described later, and the through/shunt capacitance switching element 34 by a through/shunt capacitance switching element of FIG. 24 which will be described later. The phase-shifting circuit has the same equivalent circuit as the circuit shown in FIG. 19. In addition, since the circuit operation is described in the foregoing embodiment 5, its description will be omitted here.

Figure 21:
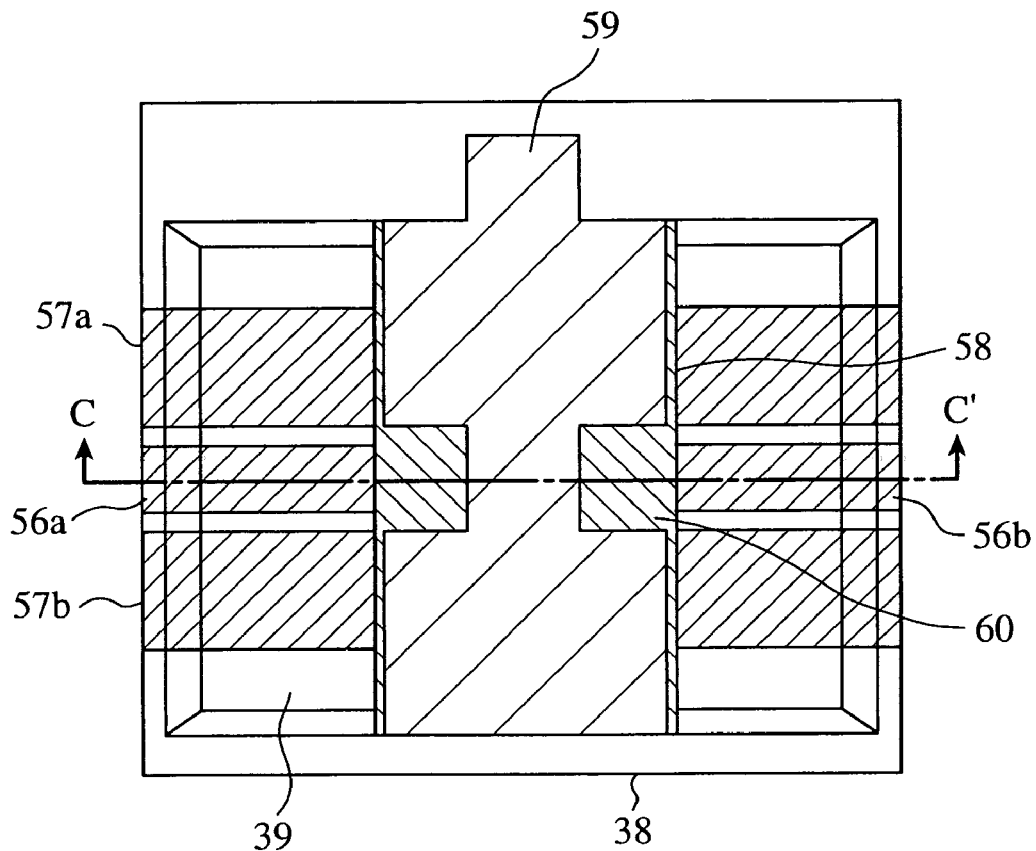
FIG. 21 is a plan view showing a detailed structure of a through/open switching element used for the phase-shifting circuit of an embodiment 6 in accordance with the present invention.

FIG. 21 is a plan view showing a detailed structure of the through/open switching element used for the phase-shifting circuit of the embodiment 6 in accordance with the present invention. In FIG. 21, the same or like portions to those of FIG. 13 are designated by the same reference numerals, and duplicate explanation will be omitted basically.

At the center of the undersurface of the cavity 39, which is formed by digging down into the single-side of the substrate 38 using the micromachining technology, a pair of beltlike high frequency signal transmission lines 56a and 56b are formed at a distance from each other. In addition, on the undersurface of the cavity 39, ground metals 57a and 57b are formed on both sides of the pair of high frequency signal transmission lines 56a and 56b. Thus, coplanar lines having the gap are formed at the center of the undersurface of the cavity 39.

A dielectric supporting film 58 is supported by the substrate 38 at the edges of the cavity 39 in such a manner as to be normally placed over the hollow of the cavity 39 via an air layer. Thus, the dielectric supporting film 58 is separated from the undersurface of the cavity 39 by a spacing from several microns to several tens of microns, and faces to part of the pair of high frequency signal transmission lines 56a and 56b including the gap (see FIG. 22 which will be described later). On the underside of the dielectric supporting film 58, a contact metal 60 is formed at a location facing to the part of the pair of high frequency signal transmission lines 56*a* and 56*b* including the gap. In addition, on the top surface of the dielectric supporting film 58, a control electrode 59 is formed at the location facing to the ground metals 57*a* and 57*b*.

Next, the operation of the through/open switching element shown in FIG. 21 will be described.

Figure 22:
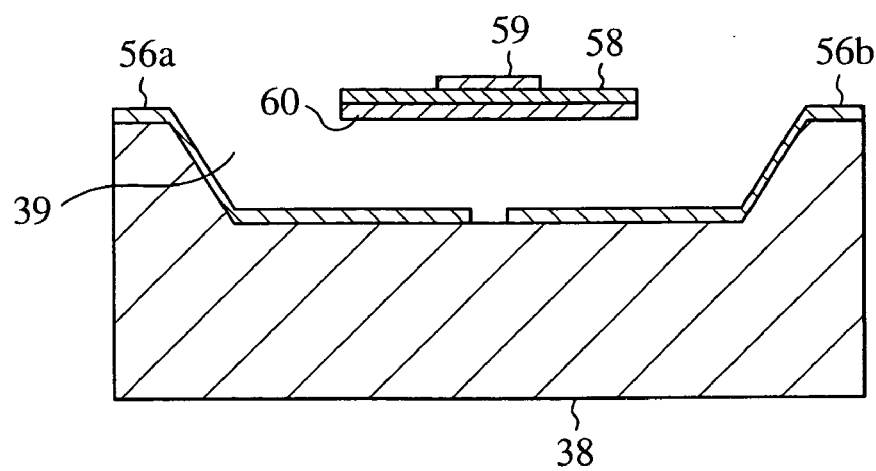
FIG. 22 is a sectional view showing an open-state structure of the through/open switching element of the embodiment 6 in accordance with the present invention.

When no voltage is applied to the control electrode 59, a structure of the through/open switching element corresponding to the section taken along the line C-C' of FIG. 21 has a sectional view as shown in FIG. 22. The dielectric supporting film 58 is placed over the hollow of the cavity 39 via the air layer. In this operation mode, the gap between the pair of high frequency signal transmission lines 56*a* and 56*b* causes the through/open switching element to form an open state.

Figure 23:
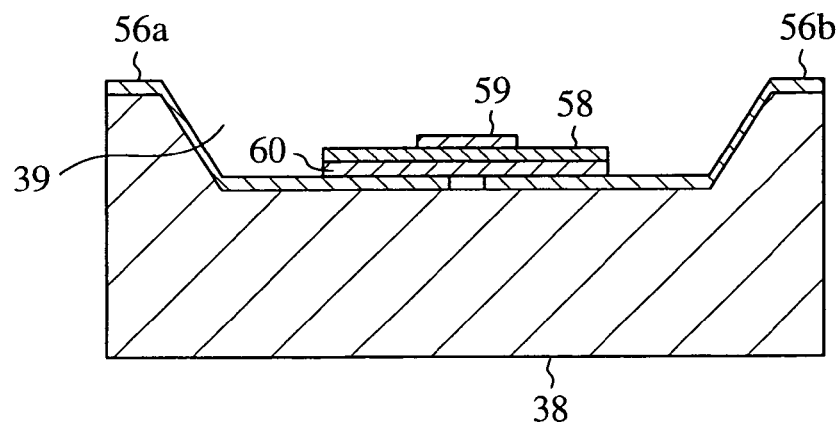
FIG. 23 is a sectional view showing a through-state structure of the through/open switching element of the embodiment 6 in accordance with the present invention.

On the other hand, when a voltage is applied to the third control electrode 59, the structure of the through/open switching element corresponding to the section taken along the line C-C' of FIG. 21 has the sectional view as shown in FIG. 23. The electrostatic attraction is exerted between the ground metals 57*a* and 57*b* (which are invisible in FIG. 23 because 57*a* is concealed by 56*a* and 56*b*, and 57*b* is placed on this side) and the control electrode 59 so that the dielectric supporting film 58 undergoes displacement toward the undersurface of the cavity 39. In this operation mode, the pair of high frequency signal transmission lines 56*a* and 56*b* make contact with the contact metal 60, and are brought into conduction. Accordingly, the through/open switching element forms a through state.

Figure 24:
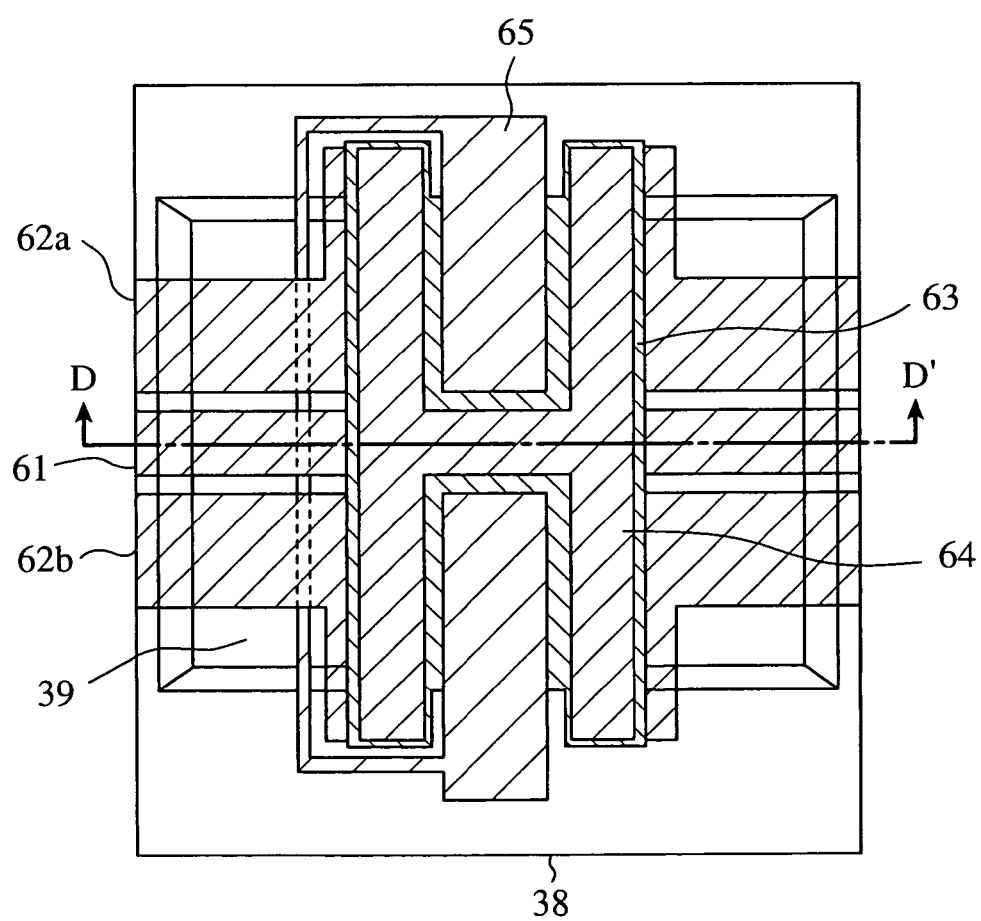
FIG. 24 is a plan view showing a detailed structure of a through/shunt capacitance switching element of the embodiment 6 in accordance with the present invention.

FIG. 24 is a plan view showing a detailed structure of the through/shunt capacitance switching element used for the phase-shifting circuit of the embodiment 6 in accordance with the present invention. In FIG. 24, the same or like portions to those of FIG. 21 are designated by the same reference numerals.

At the center of the undersurface of the cavity 39, which is formed by digging down into the single-side of the substrate 38 using the micromachining technology, a beltlike high frequency signal transmission line 61 is formed. In addition, on the undersurface of the cavity 39, ground metals 62*a* and 62*b* are formed on both sides of the high frequency signal transmission line 61. They form coplanar lines on the undersurface of the cavity 39.

A dielectric supporting film 63 is supported at the edges of the cavity in such a manner as to face to part of the high frequency signal transmission line 61 and ground metals 62*a* and 62*b*. The dielectric supporting film 63 is normally placed over the hollow of the cavity via the air layer (see FIG. 25 which will be described later). Thus, the dielectric supporting film 63 is separated from the undersurface of the cavity 39 by a spacing from several microns to several tens of microns. On the top surface of the dielectric supporting film 63, a control electrode 65 to which the control voltage is applied is formed at a location facing to the ground metals 62*e* and 62*b*. In addition, on the top surface of the dielectric supporting film 63, a metal 64 is formed at a location facing to the high frequency signal transmission line 61. The metal 64 is connected to the ground metals 62*a* and 62*b* on the substrate 38 so that it becomes equipotential to the ground.

Next, the operation of the through/shunt capacitance switching element as shown in FIG. 24 will be described.

Figure 25:
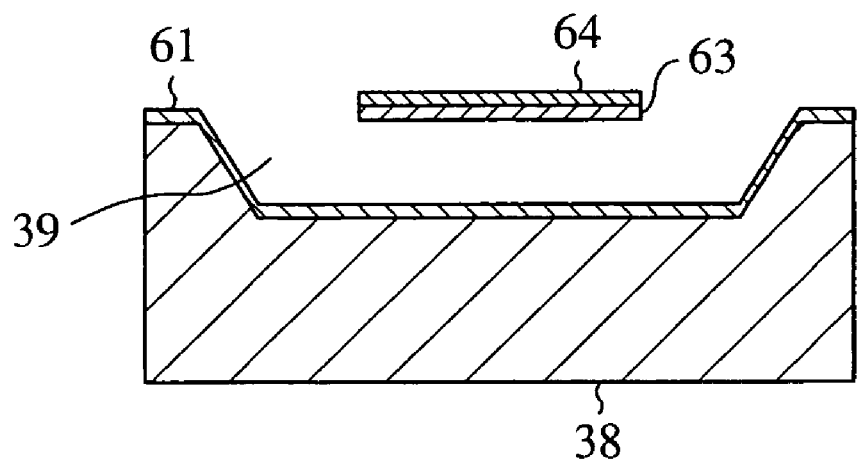
FIG. 25 is a sectional view showing a through-state structure of the through/shunt capacitance switching element of the embodiment 6 in accordance with the present invention.

When no voltage is applied to the control electrode 65, a structure of the through/shunt capacitance switching element corresponding to the section taken along the line D-D' of FIG. 24 has a sectional view as shown in FIG. 25. In this operation mode, a sufficient space is present between the dielectric supporting film 63 and the high frequency signal transmission line 61 because of the cavity 39. Accordingly, the high frequency signal is transmitted through the coplanar lines on the undersurface of the cavity 39. Thus, the through/shunt capacitance switching element forms a through state.

Figure 26:
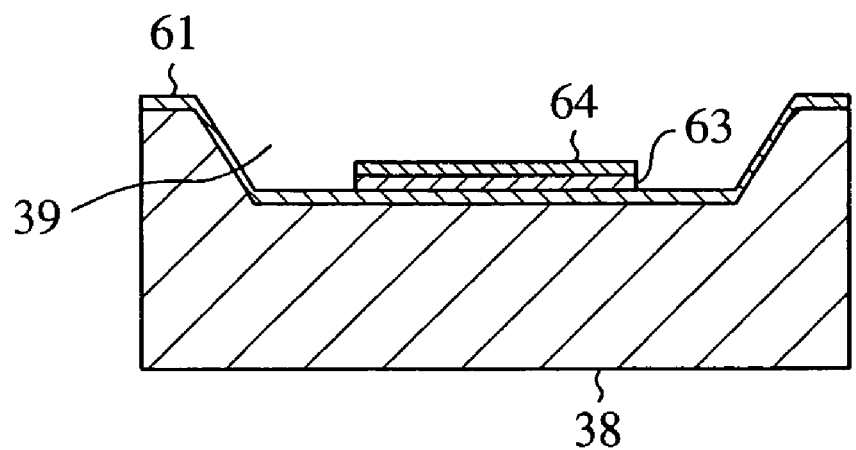
FIG. 26 is a sectional view showing a capacitance state of the through/shunt capacitance switching element of the embodiment 6 in accordance with the present invention.

On the other hand, when the voltage is applied to the control electrode 65, a structure of the through/shunt capacitance switching element corresponding to the section taken along the line D-D' of FIG. 24 has a sectional view as shown in FIG. 26. In this operation mode, the electrostatic attraction is exerted between the ground metals 62*a* and 62*b* and the fourth control electrode 65 so that the dielectric supporting film 63 undergoes displacement toward the undersurface of the cavity 39, and makes contact with the high frequency signal transmission line 61. Accordingly, the metal 64 approaches the high frequency signal transmission line 61 via the dielectric supporting film 63. Thus, the through/shunt capacitance switching element enters into a state in which it has a capacitance against the ground.

As described above, the phase-shifting circuit of the embodiment 6 forms the through state and the low-pass filtering state by the switching operation of the through/open switching element and that of the through/shunt capacitance switching element. Accordingly, as the foregoing embodiment 5, the present embodiment 6 can vary the pass phase caused when the high frequency signal input through the input terminal is output through the output terminal. In addition, since the present embodiment 6 employs the mechanically driven through/open switching element and through/shunt capacitance switching element which are produced by micromachining technology as switching elements, it can further reduce the loss as compared with the embodiments 1-4 which employ the semiconductor switching elements. Furthermore, since the present embodiment 6 employs the hollow structure, the high-frequency characteristic is little affected by the substrate. Thus, it can employ a low-cost substrate such as a low resistance silicon substrate and glass substrate, and hence reduce the cost as compared with the case of using a semiconductor substrate.

Although the phase-shifting circuit of the embodiment 6 employs as the inductors the hollow structure meander lines of the cavity formed by the single-side micromachining of the substrate, spiral inductors can also be used which are formed by patterning the two sides of the dielectric supporting film. In addition, meander lines with a structure other than the hollow structure can be formed on the substrate. Furthermore, although the foregoing phase-shifting circuit has the metal patterns formed on the dielectric supporting films in the through/open switching element and through/shunt capacitance switching element, another dielectric supporting film can be formed to make a three-layer structure. This structure, in which the metal patterns are sandwiched between the dielectric supporting films, can make the stress symmetrical in the vertical direction, and hence make it flat. Moreover, it is also possible to form a package by preparing another substrate having a cavity formed by the single-side micromachining, and covering the phase-shifting circuit from the top. This enables the mechanically driven through/open switching element and through/shunt capacitance switching element to be sealed to be protected from moisture and the like, thereby being able to increase the reliability.

EMBODIMENT 7

Figure 27:
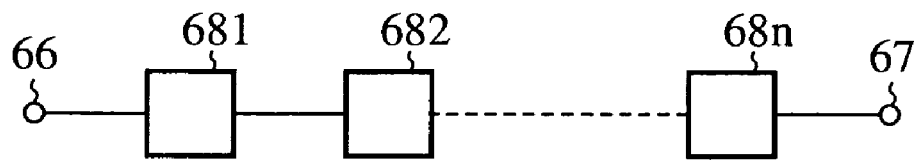
FIG. 27 is a block diagram showing a configuration of a multibit phase shifter of an embodiment 7 in accordance with the present invention.
Figure 28:
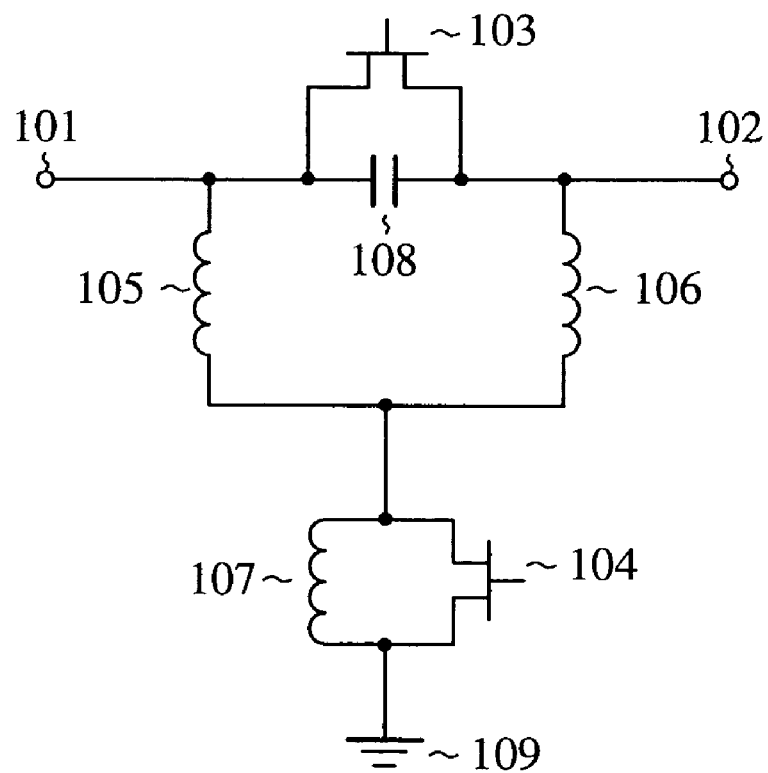
FIG. 28 is a circuit diagram showing a configuration of a conventional phase-shifting circuit.
Figure 29:
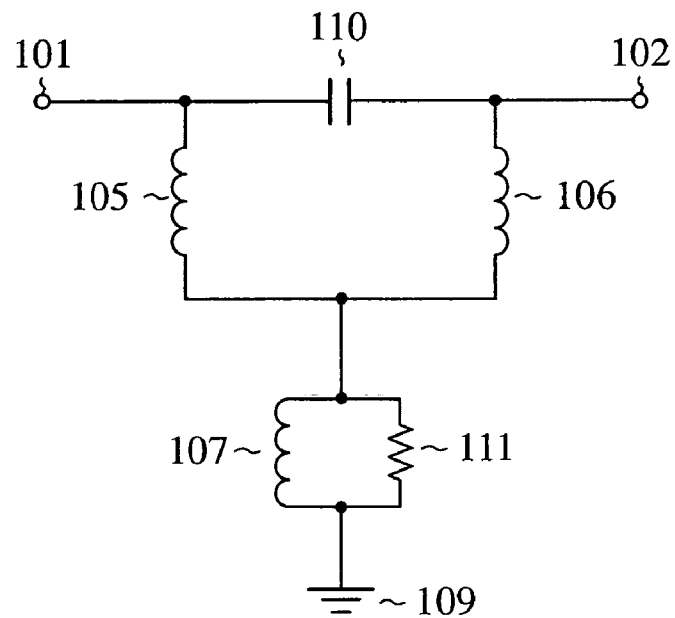
FIG. 29 is a circuit diagram showing an equivalent circuit when the conventional phase-shifting circuit operates as a high-pass filter.
Figure 30:
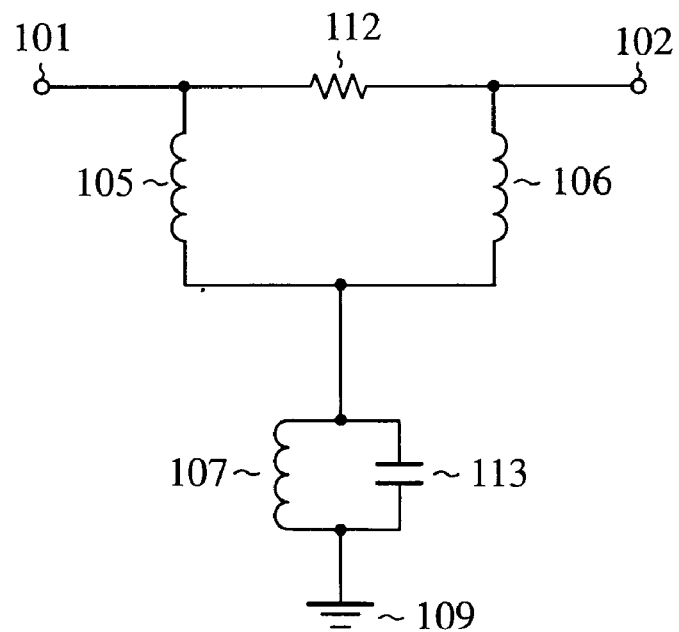
FIG. 30 is a circuit diagram showing an equivalent circuit when the conventional phase-shifting circuit operates as a bandpass filter.

FIG. 27 is a block diagram showing a configuration of a multibit phase shifter of an embodiment 7 in accordance with the present invention. The multibit phase shifter has a plurality of 1-bit phase-shifting circuits 681, 682, . . . , 68*n* connected in a multistage fashion between a high frequency signal input terminal 66 and a high frequency signal output terminal 67. As the phase-shifting circuits 681, 682, ..., 68n, one of the phase-shifting circuits described in the embodiment 1 to embodiment 6 is used.

Constructing the multibit phase shifter by connecting the 1-bit phase-shifting circuits in a multistage fashion offers an advantage of being able to implement a phase shifter capable of multibit operation.

INDUSTRIAL APPLICABILITY

As described above, the phase-shifting circuit in accordance with the present invention can reduce its size with keeping the low loss characteristic. Therefore it is suitable for a multibit phase shifter at a high frequency band such as K-band used by phased-array antennas of a mobile satellite communication system.

What is claimed is:

1. A phase-shifting circuit comprising:
   an input terminal of a high frequency signal;
   an output terminal of the high frequency signal;
   a first parallel circuit which is connected across said input terminal and said output terminal, which is composed of a first inductor and a first switching element that exhibits a through state or resistive property in an ON state and a capacitive property in an OFF state, and which produces parallel resonance at a prescribed frequency when said first switching element is in the OFF state;
   a series circuit which is connected in parallel with said first parallel circuit, and which is composed of a second inductor and a third inductor that have a reactance sufficiently larger than a resistance of said first switching element in the ON state;
   a capacitor having its first terminal connected to a point of connection of said second inductor and said third inductor;
   a second parallel circuit which is connected across a second terminal of said capacitor and a ground, which is composed of a fourth inductor and a second switching element that exhibits a through state or resistive property in an ON state and a capacitive property in an OFF state, and which produces parallel resonance at a prescribed frequency when said second switching element is in the OFF state; and
   applying means of control signals for establishing a first operation mode and a second operation mode by switching between them, said first operation mode setting said first switching element at the ON state and said second switching element at the OFF state, and said second operation mode setting said first switching element at the OFF state and said second switching element at the ON state.

2. The phase-shifting circuit according to claim 1 comprising instead of said capacitor:
   a third switching element that exhibits a through state or resistive property in an ON state and a capacitive property in an OFF state, wherein
   said applying means sets said third switching element at an ON state in the first operation mode and at an OFF state in the second operation mode.

3. The phase-shifting circuit according to claim 1, wherein said second parallel circuit is replaced by said second switching element only; and
   a combined capacitance of said capacitor and a capacitance of said second switching element in the OFF state is set at a substantially open state.

4. The phase-shifting circuit according to claim 2, wherein said second parallel circuit is replaced by said second switching element only; and
   a combined capacitance of said capacitor and a capacitance of said second switching element in the OFF state is set at a substantially open state.

5. The phase-shifting circuit according to claim 1, wherein said first parallel circuit and second parallel circuit each have a capacitor connected in parallel with them.

6. The phase-shifting circuit according to claim 2, wherein said first parallel circuit and second parallel circuit each have a capacitor connected in parallel with them.

7. The phase-shifting circuit according to claim 3, wherein said first parallel circuit and second switching element each have a capacitor connected in parallel with them.

8. The phase-shifting circuit according to claim 4, wherein said first parallel circuit and second switching element each have a capacitor connected in parallel with them.

9. A multibit phase shifter comprising a plurality of phase-shifting circuits of claim 1, which are connected in a multistage fashion and each operate as a 1-bit phase-shifting circuit.

10. A multibit phase shifter comprising a plurality of phase-shifting circuits of claim 2, which are connected in a multistage fashion and each operate as a 1-bit phase-shifting circuit.

11. A multibit phase shifter comprising a plurality of phase-shifting circuits of claim 3, which are connected in a multistage fashion and each operate as a 1-bit phase-shifting circuit.

12. A multibit phase shifter comprising a plurality of phase-shifting circuits of claim 4, which are connected in a multistage fashion and each operate as a 1-bit phase-shifting circuit.

13. A multibit phase shifter comprising a plurality of phase-shifting circuits of claim 5, which are connected in a multistage fashion and each operate as a 1-bit phase-shifting circuit.

14. A phase-shifting circuit comprising:
   an input terminal of a high frequency signal;
   an output terminal of the high frequency signal;
   a through/open switching element which is connected across said input terminal and said output terminal, and sets a transmission line at a through state or open state in response to a control voltage;
   a first inductor having its first terminal connected to said input terminal;
   a second inductor having its first terminal connected to said output terminal;
   a through/shunt capacitance switching element which is connected to a second terminal of said first inductor and to a second terminal of said second inductor, and sets a transmission line in a through state or capacitance state in response to a control voltage; and
   applying means of control voltages for establishing a first operation mode and a second operation mode by switching between them, said first operation mode setting said through/open switching element and said through/shunt capacitance switching element at a through state simultaneously, and said second operation mode setting said through/open switching element at an open state and said through/shunt capacitance switching element at a capacitance state, wherein said through/open switching element comprises:
   a substrate having a cavity formed by digging down into a single-side of said substrate;

a contact metal formed at the center of an undersurface of said cavity;

a control electrode formed around said contact metal on the undersurface of said cavity;

a dielectric supporting film which is supported by edges of said cavity at a location facing to said contact metal and said control electrode, which has a pair of through holes at positions facing to said contact metal, and which is located over a hollow of said cavity via an air layer in a normal state in which no control voltage is applied to said control electrode;

a pair of high frequency signal transmission lines which are placed on said dielectric supporting film across a gap, and which have conductive projections facing to said contact metal through said pair of through holes at an underside of said dielectric supporting film;

a ground metal placed on said dielectric supporting film at a location corresponding to said control electrode, wherein the control voltage, when applied to said control electrode, brings about electrostatic attraction between said control electrode and said ground metal, which electrostatic attraction causes displacement of said dielectric supporting film toward the undersurface of said cavity to bring said conductive projections into contact with said contact metal, thereby bringing about a through state between said pair of high frequency signal transmission lines.

15. A multibit phase shifter comprising a plurality of phase-shifting circuits of claim 14, which are connected in a multistage fashion and each operate as a 1-bit phase-shifting circuit.

16. A phase-shifting circuit comprising:

an input terminal of a high frequency signal;

an output terminal of the high frequency signal;

a through/open switching element which is connected across said input terminal and said output terminal, and sets a transmission line at a through state or open state in response to a control voltage;

a first inductor having its first terminal connected to said input terminal;

a second inductor having its first terminal connected to said output terminal;

a through/shunt capacitance switching element which is connected to a second terminal of said first inductor and to a second terminal of said second inductor, and sets a transmission line in a through state or capacitance state in response to a control voltage; and applying means of control voltages for establishing a first operation mode and a second operation mode by switching between them, said first operation mode setting said through/open switching element and said through/shunt capacitance switching element at a through state simultaneously, and said second operation mode setting said through/open switching element at an open state and said through/shunt capacitance switching element at a capacitance state, wherein said through/shunt capacitance switching element comprises:

a substrate having a cavity formed by digging down into a single-side of said substrate;

a belt-like first ground metal formed at the center of an undersurface of said cavity;

a control electrode formed on both sides of said first ground metal on the undersurface of said cavity;

a dielectric supporting film which is supported by edges of said cavity at a location facing to said first ground metal and said control electrode, and which is located over a hollow of said cavity via an air layer in a normal state in which no control voltage is applied to said control electrode;

a high frequency signal transmission line which is placed on said dielectric supporting film at a location facing to said first ground metal;

a second ground metal formed on said dielectric supporting film at a location facing to said control electrode, wherein the control voltage, when applied to said control electrode, brings about electrostatic attraction between said control electrode and said second ground metal, which electrostatic attraction causes displacement of said dielectric supporting film toward the undersurface of said cavity to bring said dielectric supporting film into contact with said first ground metal, thereby causing said high frequency signal transmission line to have a capacitance with said first ground metal.

17. A multibit phase shifter comprising a plurality of phase-shifting circuits of claim 16, which are connected in a multistage fashion and each operate as a 1-bit phase-shifting circuit.

18. A phase-shifting circuit comprising:

an input terminal of a high frequency signal;

an output terminal of the high frequency signal;

a through/open switching element which is connected across said input terminal and said output terminal, and sets a transmission line at a through state or open state in response to a control voltage;

a first inductor having its first terminal connected to said input terminal;

a second inductor having its first terminal connected to said output terminal;

a through/shunt capacitance switching element which is connected to a second terminal of said first inductor and to a second terminal of said second inductor, and sets a transmission line in a through state or capacitance state in response to a control voltage; and applying means of control voltages for establishing a first operation mode and a second operation mode by switching between them, said first operation mode setting said through/open switching element and said through/shunt capacitance switching element at a through state simultaneously, and said second operation mode setting said through/open switching element at an open state and said through/shunt capacitance switching element at a capacitance state, wherein said through/open switching element comprises:

a substrate having a cavity formed by digging down into a single-side of said substrate;

a pair of high frequency signal transmission lines which are formed at the center of an undersurface of said cavity across a gap;

a ground metal formed on both sides of said pair of high frequency signal transmission lines on the undersurface of said cavity;

a dielectric supporting film which is supported by edges of said cavity with facing to a region including the gap of said pair of high frequency signal transmission lines, and which is located over a hollow of said cavity via an air layer in a normal state;

a contact metal formed on an undersurface of said dielectric supporting film facing to the region including the gap of said pair of high frequency signal transmission lines; and a control electrode formed on a top surface of said dielectric supporting film with facing to said ground metal, wherein the control voltage, when applied to said control electrode, brings about electrostatic attraction between said control electrode and said ground metal, which electrostatic attraction causes displacement of said dielectric supporting film toward the undersurface of said cavity to bring said contact metal into contact with said pair of high frequency signal lines, thereby bringing about a through state between said pair of high frequency signal transmission lines.

19. A multibit phase shifter comprising a plurality of phase-shifting circuits of claim 18, which are connected in a multistage fashion and each operate as a 1-bit phase-shifting circuit.

20. A phase-shifting circuit comprising:

an input terminal of a high frequency signal;

an output terminal of the high frequency signal;

a through/open switching element which is connected across said input terminal and said output terminal, and sets a transmission line at a through state or open state in response to a control voltage;

a first inductor having its first terminal connected to said input terminal;

a second inductor having its first terminal connected to said output terminal;

a through/shunt capacitance switching element which is connected to a second terminal of said first inductor and to a second terminal of said second inductor, and sets a transmission line in a through state or capacitance state in response to a control voltage; and applying means of control voltages for establishing a first operation mode and a second operation mode by switching between them, said first operation mode setting said through/open switching element and said through/shunt capacitance switching element at a through state simultaneously, and said second operation mode setting said through/open switching element at an open state and said through/shunt capacitance switching element at a capacitance state, wherein said through/shunt capacitance switching element comprises:

a substrate having a cavity formed by digging down into a single-side of said substrate;

a belt-like high frequency signal transmission line formed at the center of an undersurface of said cavity;

a ground metal formed on both sides of said high frequency signal transmission line on the undersurface of said cavity;

a dielectric supporting film which is supported by edges of said cavity with facing to a region of said high frequency signal transmission line and said ground metal, and which is located over a hollow of said cavity via an air layer in a normal state;

a control electrode formed on a top surface of said dielectric supporting film with facing to said ground metal; and a metal which is formed on the top surface of said dielectric supporting film with facing to said high frequency signal transmission line, and which is placed at an equipotential with the ground, wherein the control voltage, when applied to said control electrode, brings about electrostatic attraction between said control electrode and said ground metal, which electrostatic attraction causes displacement of said dielectric supporting film toward the undersurface of said cavity to bring said dielectric supporting film into contact with said high frequency signal transmission line, thereby causing said high frequency signal transmission line to have a capacitance with said metal.

21. A multibit phase shifter comprising a plurality of phase-shifting circuits of claim 20, which are connected in a multistage fashion and each operate as a 1-bit phase-shifting circuit.

* * * * *